United States Patent
Sugita

(10) Patent No.: US 8,223,041 B2
(45) Date of Patent: Jul. 17, 2012

(54) INFORMATION PROCESSING APPARATUS, AND SIGNAL PROCESSING METHOD

(75) Inventor: Takehiro Sugita, Kanagawa (JP)

(73) Assignee: Sony Corporation, Tokyo (JP)

( * ) Notice: Subject to any disclaimer, the term of this patent is extended or adjusted under 35 U.S.C. 154(b) by 71 days.

(21) Appl. No.: 12/938,606

(22) Filed: Nov. 3, 2010

(65) Prior Publication Data

US 2011/0109484 A1      May 12, 2011

(30) Foreign Application Priority Data

Nov. 10, 2009   (JP) ................................ 2009-257350

(51) Int. Cl.
  *H03M 5/00*   (2006.01)
(52) U.S. Cl. ................. 341/55; 341/56; 341/57; 341/58
(58) Field of Classification Search ............... 341/55–58
  See application file for complete search history.

(56) References Cited

U.S. PATENT DOCUMENTS

| | | | |
|---|---|---|---|
| 4,486,739 A | * | 12/1984 | Franaszek et al. ............... 341/59 |
| 5,387,911 A | * | 2/1995 | Gleichert et al. ............... 341/95 |
| 6,653,957 B1 | * | 11/2003 | Patterson et al. ............. 341/100 |
| 7,006,018 B2 | * | 2/2006 | Noda et al. ....................... 341/58 |

FOREIGN PATENT DOCUMENTS

JP     03-010984     1/1991

* cited by examiner

*Primary Examiner* — Khai M Nguyen
(74) *Attorney, Agent, or Firm* — Wolf, Greenfield & Sacks, P.C.

(57) ABSTRACT

Provided is an information processing apparatus including a distributor that distributes input data in units of M bits and generates N M-bit bit sequences, an encoder that converts each of the N bit sequences distributed by the distributor into a binary symbol sequence of K symbols and generates N binary symbol sequences, a signal generator that generates N transmission signals Sj synchronized with a specific symbol clock and having, as an amplitude value, each symbol value included in the N binary symbol sequences, a signal delay unit that delays, with regard to j, the transmission signals Sj generated by the signal generator by a (j−1)/N-symbol period and generates delay signals Rj, a signal addition unit that adds the delay signals Rj generated by the signal delay unit and generates an added signal, and a signal transmitter that transmits the added signal generated by the signal addition unit.

12 Claims, 23 Drawing Sheets

FIG. 7A

| 8bit Data | 6T Data | | | | | | Total |
|---|---|---|---|---|---|---|---|
| 00 | +1 | −1 | 0 | 0 | +1 | −1 | 0 |
| 01 | 0 | +1 | −1 | +1 | −1 | 0 | 0 |
| 02 | +1 | −1 | 0 | +1 | −1 | 0 | 0 |
| 03 | −1 | 0 | +1 | +1 | −1 | 0 | 0 |
| 04 | −1 | 0 | +1 | 0 | +1 | −1 | 0 |
| 05 | 0 | +1 | −1 | −1 | 0 | +1 | 0 |
| 06 | +1 | −1 | 0 | −1 | 0 | +1 | 0 |
| 07 | −1 | 0 | +1 | −1 | 0 | +1 | 0 |
| 08 | −1 | +1 | 0 | 0 | +1 | −1 | 0 |
| 09 | 0 | −1 | +1 | +1 | −1 | 0 | 0 |
| 0A | −1 | +1 | 0 | +1 | −1 | 0 | 0 |
| 0B | +1 | 0 | −1 | +1 | −1 | 0 | 0 |
| 0C | +1 | 0 | −1 | 0 | +1 | −1 | 0 |
| 0D | 0 | −1 | +1 | −1 | 0 | +1 | 0 |
| 0E | −1 | +1 | 0 | −1 | 0 | +1 | 0 |
| 0F | +1 | 0 | −1 | −1 | 0 | +1 | 0 |

| 8bit Data | 6T Data | | | | | | Total |
|---|---|---|---|---|---|---|---|
| 10 | +1 | 0 | +1 | −1 | −1 | 0 | 0 |
| 11 | +1 | +1 | 0 | −1 | 0 | −1 | 0 |
| 12 | +1 | 0 | +1 | −1 | 0 | −1 | 0 |
| 13 | 0 | +1 | +1 | −1 | 0 | −1 | 0 |
| 14 | 0 | +1 | +1 | −1 | −1 | 0 | 0 |
| 15 | +1 | +1 | 0 | 0 | −1 | −1 | 0 |
| 16 | +1 | 0 | +1 | 0 | −1 | −1 | 0 |
| 17 | 0 | +1 | +1 | 0 | −1 | −1 | 0 |
| 18 | 0 | +1 | −1 | 0 | +1 | −1 | 0 |
| 19 | 0 | +1 | −1 | 0 | −1 | +1 | 0 |
| 1A | 0 | +1 | −1 | +1 | +1 | −1 | +1 |
| 1B | 0 | +1 | −1 | 0 | 0 | +1 | +1 |
| 1C | 0 | −1 | +1 | 0 | 0 | +1 | +1 |
| 1D | 0 | −1 | +1 | +1 | +1 | −1 | +1 |
| 1E | 0 | −1 | +1 | 0 | −1 | +1 | 0 |
| 1F | 0 | −1 | +1 | 0 | +1 | −1 | 0 |

| 8bit Data | 6T Data | | | | | | Total |
|---|---|---|---|---|---|---|---|
| 20 | 0 | 0 | −1 | +1 | +1 | −1 | 0 |
| 21 | −1 | −1 | +1 | 0 | 0 | +1 | 0 |
| 22 | +1 | +1 | −1 | 0 | +1 | −1 | +1 |
| 23 | +1 | +1 | −1 | 0 | −1 | +1 | +1 |
| 24 | 0 | 0 | +1 | 0 | −1 | +1 | +1 |
| 25 | 0 | 0 | +1 | 0 | +1 | −1 | +1 |
| 26 | 0 | 0 | −1 | 0 | 0 | +1 | 0 |
| 27 | −1 | −1 | +1 | +1 | +1 | −1 | 0 |
| 28 | −1 | 0 | −1 | +1 | +1 | 0 | 0 |
| 29 | −1 | −1 | 0 | +1 | 0 | +1 | 0 |
| 2A | −1 | 0 | −1 | +1 | 0 | +1 | 0 |
| 2B | 0 | −1 | −1 | +1 | 0 | +1 | 0 |
| 2C | 0 | −1 | −1 | +1 | +1 | 0 | 0 |
| 2D | −1 | −1 | 0 | 0 | +1 | +1 | 0 |
| 2E | −1 | 0 | −1 | 0 | +1 | +1 | 0 |
| 2F | 0 | −1 | −1 | 0 | +1 | +1 | 0 |

| 8bit Data | 6T Data | | | | | | Total |
|---|---|---|---|---|---|---|---|
| 30 | +1 | −1 | 0 | 0 | −1 | +1 | 0 |
| 31 | 0 | +1 | −1 | −1 | +1 | 0 | 0 |
| 32 | +1 | −1 | 0 | −1 | +1 | 0 | 0 |
| 33 | −1 | 0 | +1 | −1 | +1 | 0 | 0 |
| 34 | −1 | 0 | +1 | 0 | −1 | +1 | 0 |
| 35 | 0 | +1 | −1 | +1 | 0 | −1 | 0 |
| 36 | +1 | −1 | 0 | +1 | 0 | −1 | 0 |
| 37 | −1 | 0 | +1 | +1 | 0 | −1 | 0 |
| 38 | −1 | +1 | 0 | 0 | −1 | +1 | 0 |
| 39 | 0 | −1 | +1 | −1 | +1 | 0 | 0 |
| 3A | −1 | +1 | 0 | −1 | +1 | 0 | 0 |
| 3B | +1 | 0 | −1 | −1 | +1 | 0 | 0 |
| 3C | +1 | 0 | −1 | 0 | −1 | +1 | 0 |
| 3D | 0 | −1 | +1 | +1 | 0 | −1 | 0 |
| 3E | −1 | +1 | 0 | +1 | 0 | −1 | 0 |
| 3F | +1 | 0 | −1 | +1 | 0 | −1 | 0 |

FIG. 7B

| 8bit Data | 6T Data | | | | | | Total |
|---|---|---|---|---|---|---|---|
| 40 | +1 | 0 | +1 | 0 | 0 | -1 | +1 |
| 41 | +1 | +1 | 0 | 0 | -1 | 0 | +1 |
| 42 | +1 | 0 | +1 | 0 | -1 | 0 | +1 |
| 43 | 0 | +1 | +1 | 0 | -1 | 0 | +1 |
| 44 | 0 | +1 | +1 | 0 | 0 | -1 | +1 |
| 45 | +1 | +1 | 0 | -1 | 0 | 0 | +1 |
| 46 | +1 | 0 | +1 | -1 | 0 | 0 | +1 |
| 47 | 0 | +1 | +1 | -1 | 0 | 0 | +1 |
| 48 | 0 | 0 | 0 | +1 | 0 | 0 | +1 |
| 49 | 0 | 0 | 0 | -1 | +1 | +1 | +1 |
| 4A | 0 | 0 | 0 | +1 | -1 | +1 | +1 |
| 4B | 0 | 0 | 0 | +1 | +1 | -1 | +1 |
| 4C | 0 | 0 | 0 | -1 | +1 | 0 | 0 |
| 4D | 0 | 0 | 0 | -1 | 0 | +1 | 0 |
| 4E | 0 | 0 | 0 | +1 | -1 | 0 | 0 |
| 4F | 0 | 0 | 0 | +1 | 0 | -1 | 0 |

| 8bit Data | 6T Data | | | | | | Total |
|---|---|---|---|---|---|---|---|
| 50 | +1 | 0 | +1 | -1 | -1 | +1 | +1 |
| 51 | +1 | +1 | 0 | -1 | +1 | -1 | +1 |
| 52 | +1 | 0 | +1 | -1 | +1 | -1 | +1 |
| 53 | 0 | +1 | +1 | -1 | +1 | -1 | +1 |
| 54 | 0 | +1 | +1 | -1 | -1 | +1 | +1 |
| 55 | +1 | +1 | 0 | +1 | -1 | -1 | +1 |
| 56 | +1 | 0 | +1 | +1 | -1 | -1 | +1 |
| 57 | 0 | +1 | +1 | +1 | -1 | -1 | +1 |
| 58 | +1 | +1 | +1 | 0 | -1 | -1 | +1 |
| 59 | +1 | +1 | +1 | -1 | 0 | -1 | +1 |
| 5A | +1 | +1 | +1 | -1 | -1 | 0 | +1 |
| 5B | +1 | +1 | 0 | -1 | -1 | 0 | 0 |
| 5C | +1 | +1 | 0 | -1 | -1 | +1 | +1 |
| 5D | +1 | +1 | 0 | 0 | 0 | -1 | +1 |
| 5E | -1 | -1 | +1 | +1 | +1 | 0 | +1 |
| 5F | 0 | 0 | -1 | +1 | +1 | 0 | +1 |

| 8bit Data | 6T Data | | | | | | Total |
|---|---|---|---|---|---|---|---|
| 60 | 0 | -1 | 0 | +1 | +1 | 0 | +1 |
| 61 | 0 | 0 | -1 | +1 | 0 | +1 | +1 |
| 62 | 0 | -1 | 0 | +1 | 0 | +1 | +1 |
| 63 | -1 | 0 | 0 | +1 | 0 | +1 | +1 |
| 64 | -1 | 0 | 0 | +1 | +1 | 0 | +1 |
| 65 | 0 | 0 | -1 | 0 | +1 | +1 | +1 |
| 66 | 0 | -1 | 0 | 0 | +1 | +1 | +1 |
| 67 | -1 | 0 | 0 | 0 | +1 | +1 | +1 |
| 68 | -1 | +1 | -1 | +1 | +1 | 0 | +1 |
| 69 | -1 | -1 | +1 | +1 | 0 | +1 | +1 |
| 6A | -1 | +1 | -1 | +1 | 0 | +1 | +1 |
| 6B | +1 | -1 | -1 | +1 | 0 | +1 | +1 |
| 6C | +1 | -1 | -1 | +1 | +1 | 0 | +1 |
| 6D | -1 | -1 | +1 | 0 | +1 | +1 | +1 |
| 6E | -1 | +1 | -1 | 0 | +1 | +1 | +1 |
| 6F | +1 | -1 | -1 | 0 | +1 | +1 | +1 |

| 8bit Data | 6T Data | | | | | | Total |
|---|---|---|---|---|---|---|---|
| 70 | -1 | +1 | +1 | 0 | 0 | 0 | +1 |
| 71 | +1 | -1 | +1 | 0 | 0 | 0 | +1 |
| 72 | +1 | +1 | -1 | 0 | 0 | 0 | +1 |
| 73 | 0 | 0 | +1 | 0 | 0 | 0 | +1 |
| 74 | -1 | 0 | +1 | 0 | 0 | 0 | 0 |
| 75 | 0 | -1 | +1 | 0 | 0 | 0 | 0 |
| 76 | +1 | 0 | -1 | 0 | 0 | 0 | 0 |
| 77 | 0 | +1 | -1 | 0 | 0 | 0 | 0 |
| 78 | 0 | -1 | -1 | +1 | +1 | +1 | +1 |
| 79 | -1 | 0 | -1 | +1 | +1 | +1 | +1 |
| 7A | -1 | -1 | 0 | +1 | +1 | +1 | +1 |
| 7B | -1 | -1 | 0 | +1 | +1 | 0 | 0 |
| 7C | +1 | +1 | -1 | 0 | 0 | -1 | 0 |
| 7D | 0 | 0 | +1 | 0 | 0 | -1 | 0 |
| 7E | +1 | +1 | -1 | -1 | -1 | +1 | 0 |
| 7F | 0 | 0 | +1 | -1 | -1 | +1 | 0 |

FIG. 7C

| 8bit Data | 6T Data | | | | | | Total |
|---|---|---|---|---|---|---|---|
| 80 | +1 | −1 | +1 | 0 | 0 | −1 | 0 |
| 81 | +1 | +1 | −1 | 0 | −1 | 0 | 0 |
| 82 | +1 | −1 | +1 | 0 | −1 | 0 | 0 |
| 83 | −1 | +1 | +1 | 0 | −1 | 0 | 0 |
| 84 | −1 | +1 | +1 | 0 | 0 | −1 | 0 |
| 85 | +1 | +1 | −1 | −1 | 0 | 0 | 0 |
| 86 | +1 | −1 | +1 | −1 | 0 | 0 | 0 |
| 87 | −1 | +1 | +1 | −1 | 0 | 0 | 0 |
| 88 | 0 | +1 | 0 | 0 | 0 | −1 | 0 |
| 89 | 0 | 0 | +1 | 0 | −1 | 0 | 0 |
| 8A | 0 | +1 | 0 | 0 | −1 | 0 | 0 |
| 8B | +1 | 0 | 0 | 0 | −1 | 0 | 0 |
| 8C | +1 | 0 | 0 | 0 | 0 | −1 | 0 |
| 8D | 0 | 0 | +1 | −1 | 0 | 0 | 0 |
| 8E | 0 | +1 | 0 | −1 | 0 | 0 | 0 |
| 8F | +1 | 0 | 0 | −1 | 0 | 0 | 0 |

| 8bit Data | 6T Data | | | | | | Total |
|---|---|---|---|---|---|---|---|
| 90 | +1 | −1 | +1 | −1 | −1 | +1 | 0 |
| 91 | +1 | +1 | −1 | −1 | +1 | −1 | 0 |
| 92 | +1 | −1 | +1 | −1 | +1 | −1 | 0 |
| 93 | −1 | +1 | +1 | −1 | +1 | −1 | 0 |
| 94 | −1 | +1 | +1 | −1 | −1 | +1 | 0 |
| 95 | +1 | +1 | −1 | +1 | −1 | −1 | 0 |
| 96 | +1 | −1 | +1 | +1 | −1 | −1 | 0 |
| 97 | −1 | +1 | +1 | +1 | −1 | −1 | 0 |
| 98 | 0 | +1 | 0 | −1 | −1 | +1 | 0 |
| 99 | 0 | 0 | +1 | −1 | +1 | −1 | 0 |
| 9A | 0 | +1 | 0 | −1 | +1 | −1 | 0 |
| 9B | +1 | 0 | 0 | −1 | +1 | −1 | 0 |
| 9C | +1 | 0 | 0 | −1 | −1 | +1 | 0 |
| 9D | 0 | 0 | +1 | +1 | −1 | −1 | 0 |
| 9E | 0 | +1 | 0 | +1 | −1 | −1 | 0 |
| 9F | +1 | 0 | 0 | +1 | −1 | −1 | 0 |

| 8bit Data | 6T Data | | | | | | Total |
|---|---|---|---|---|---|---|---|
| A0 | 0 | −1 | 0 | +1 | +1 | −1 | 0 |
| A1 | 0 | 0 | −1 | +1 | −1 | +1 | 0 |
| A2 | 0 | −1 | 0 | +1 | −1 | +1 | 0 |
| A3 | −1 | 0 | 0 | +1 | −1 | +1 | 0 |
| A4 | −1 | 0 | 0 | +1 | +1 | −1 | 0 |
| A5 | 0 | 0 | −1 | −1 | +1 | +1 | 0 |
| A6 | 0 | −1 | 0 | −1 | +1 | +1 | 0 |
| A7 | −1 | 0 | 0 | −1 | +1 | +1 | 0 |
| A8 | −1 | +1 | −1 | +1 | +1 | −1 | 0 |
| A9 | −1 | −1 | +1 | +1 | −1 | +1 | 0 |
| AA | −1 | +1 | −1 | +1 | −1 | +1 | 0 |
| AB | +1 | −1 | −1 | +1 | −1 | +1 | 0 |
| AC | +1 | −1 | −1 | +1 | +1 | −1 | 0 |
| AD | −1 | −1 | +1 | −1 | +1 | +1 | 0 |
| AE | −1 | +1 | −1 | −1 | +1 | +1 | 0 |
| AF | +1 | −1 | −1 | −1 | +1 | +1 | 0 |

| 8bit Data | 6T Data | | | | | | Total |
|---|---|---|---|---|---|---|---|
| B0 | 0 | −1 | 0 | 0 | 0 | +1 | 0 |
| B1 | 0 | 0 | −1 | 0 | +1 | 0 | 0 |
| B2 | 0 | −1 | 0 | 0 | +1 | 0 | 0 |
| B3 | −1 | 0 | 0 | 0 | +1 | 0 | 0 |
| B4 | −1 | 0 | 0 | 0 | 0 | +1 | 0 |
| B5 | 0 | 0 | −1 | +1 | 0 | 0 | 0 |
| B6 | 0 | −1 | 0 | +1 | 0 | 0 | 0 |
| B7 | −1 | 0 | 0 | +1 | 0 | 0 | 0 |
| B8 | −1 | +1 | −1 | 0 | 0 | +1 | 0 |
| B9 | −1 | −1 | +1 | 0 | +1 | 0 | 0 |
| BA | −1 | +1 | −1 | 0 | +1 | 0 | 0 |
| BB | +1 | −1 | −1 | 0 | +1 | 0 | 0 |
| BC | +1 | −1 | −1 | 0 | 0 | +1 | 0 |
| BD | −1 | −1 | +1 | +1 | 0 | 0 | 0 |
| BE | −1 | +1 | −1 | +1 | 0 | 0 | 0 |
| BF | +1 | −1 | −1 | +1 | 0 | 0 | 0 |

FIG. 7D

| 8bit Data | 6T Data | | | | | | Total |
|---|---|---|---|---|---|---|---|
| C0 | +1 | −1 | +1 | 0 | +1 | −1 | +1 |
| C1 | +1 | +1 | −1 | +1 | −1 | 0 | +1 |
| C2 | +1 | −1 | +1 | +1 | −1 | 0 | +1 |
| C3 | −1 | +1 | +1 | +1 | −1 | 0 | +1 |
| C4 | −1 | +1 | +1 | 0 | +1 | −1 | +1 |
| C5 | +1 | +1 | −1 | −1 | 0 | +1 | +1 |
| C6 | +1 | −1 | +1 | −1 | 0 | +1 | +1 |
| C7 | −1 | +1 | +1 | −1 | 0 | +1 | +1 |
| C8 | 0 | +1 | 0 | 0 | +1 | −1 | +1 |
| C9 | 0 | 0 | +1 | +1 | −1 | 0 | +1 |
| CA | 0 | +1 | 0 | +1 | −1 | 0 | +1 |
| CB | +1 | 0 | 0 | +1 | −1 | 0 | +1 |
| CC | +1 | 0 | 0 | 0 | +1 | −1 | +1 |
| CD | 0 | 0 | +1 | −1 | 0 | +1 | +1 |
| CE | 0 | +1 | 0 | −1 | 0 | +1 | +1 |
| CF | +1 | 0 | 0 | −1 | 0 | +1 | +1 |

| 8bit Data | 6T Data | | | | | | Total |
|---|---|---|---|---|---|---|---|
| D0 | +1 | −1 | +1 | 0 | −1 | +1 | +1 |
| D1 | +1 | +1 | −1 | −1 | +1 | 0 | +1 |
| D2 | +1 | −1 | +1 | −1 | +1 | 0 | +1 |
| D3 | −1 | +1 | +1 | −1 | +1 | 0 | +1 |
| D4 | −1 | +1 | +1 | 0 | −1 | +1 | +1 |
| D5 | +1 | +1 | −1 | +1 | 0 | −1 | +1 |
| D6 | +1 | −1 | +1 | +1 | 0 | −1 | +1 |
| D7 | −1 | +1 | +1 | +1 | 0 | −1 | +1 |
| D8 | 0 | +1 | 0 | 0 | −1 | +1 | +1 |
| D9 | 0 | 0 | +1 | −1 | +1 | 0 | +1 |
| DA | 0 | +1 | 0 | −1 | +1 | 0 | +1 |
| DB | +1 | 0 | 0 | −1 | +1 | 0 | +1 |
| DC | +1 | 0 | 0 | 0 | −1 | +1 | +1 |
| DD | 0 | 0 | +1 | +1 | 0 | −1 | +1 |
| DE | 0 | +1 | 0 | +1 | 0 | −1 | +1 |
| DF | +1 | 0 | 0 | +1 | 0 | −1 | +1 |

| 8bit Data | 6T Data | | | | | | Total |
|---|---|---|---|---|---|---|---|
| E0 | +1 | −1 | 0 | +1 | +1 | −1 | +1 |
| E1 | 0 | +1 | −1 | +1 | −1 | +1 | +1 |
| E2 | +1 | −1 | 0 | +1 | −1 | +1 | +1 |
| E3 | −1 | 0 | +1 | +1 | −1 | +1 | +1 |
| E4 | −1 | 0 | +1 | +1 | +1 | −1 | +1 |
| E5 | 0 | +1 | −1 | −1 | +1 | +1 | +1 |
| E6 | +1 | −1 | 0 | −1 | +1 | +1 | +1 |
| E7 | −1 | 0 | +1 | −1 | +1 | +1 | +1 |
| E8 | −1 | +1 | 0 | +1 | +1 | −1 | +1 |
| E9 | 0 | −1 | +1 | +1 | −1 | +1 | +1 |
| EA | −1 | +1 | 0 | +1 | −1 | +1 | +1 |
| EB | +1 | 0 | −1 | +1 | −1 | +1 | +1 |
| EC | +1 | 0 | −1 | +1 | +1 | −1 | +1 |
| ED | 0 | −1 | +1 | −1 | +1 | +1 | +1 |
| EE | −1 | +1 | 0 | −1 | +1 | +1 | +1 |
| EF | +1 | 0 | −1 | −1 | +1 | +1 | +1 |

| 8bit Data | 6T Data | | | | | | Total |
|---|---|---|---|---|---|---|---|
| F0 | +1 | −1 | 0 | 0 | 0 | +1 | +1 |
| F1 | 0 | +1 | −1 | 0 | +1 | 0 | +1 |
| F2 | +1 | −1 | 0 | 0 | +1 | 0 | +1 |
| F3 | −1 | 0 | +1 | 0 | +1 | 0 | +1 |
| F4 | −1 | 0 | +1 | 0 | 0 | +1 | +1 |
| F5 | 0 | +1 | −1 | +1 | 0 | 0 | +1 |
| F6 | +1 | −1 | 0 | +1 | 0 | 0 | +1 |
| F7 | −1 | 0 | +1 | +1 | 0 | 0 | +1 |
| F8 | −1 | +1 | 0 | 0 | 0 | +1 | +1 |
| F9 | 0 | −1 | +1 | 0 | +1 | 0 | +1 |
| FA | −1 | +1 | 0 | 0 | +1 | 0 | +1 |
| FB | +1 | 0 | −1 | 0 | +1 | 0 | +1 |
| FC | +1 | 0 | −1 | 0 | 0 | +1 | +1 |
| FD | 0 | −1 | +1 | +1 | 0 | 0 | +1 |
| FE | −1 | +1 | 0 | +1 | 0 | 0 | +1 |
| FF | +1 | 0 | −1 | +1 | 0 | 0 | +1 |

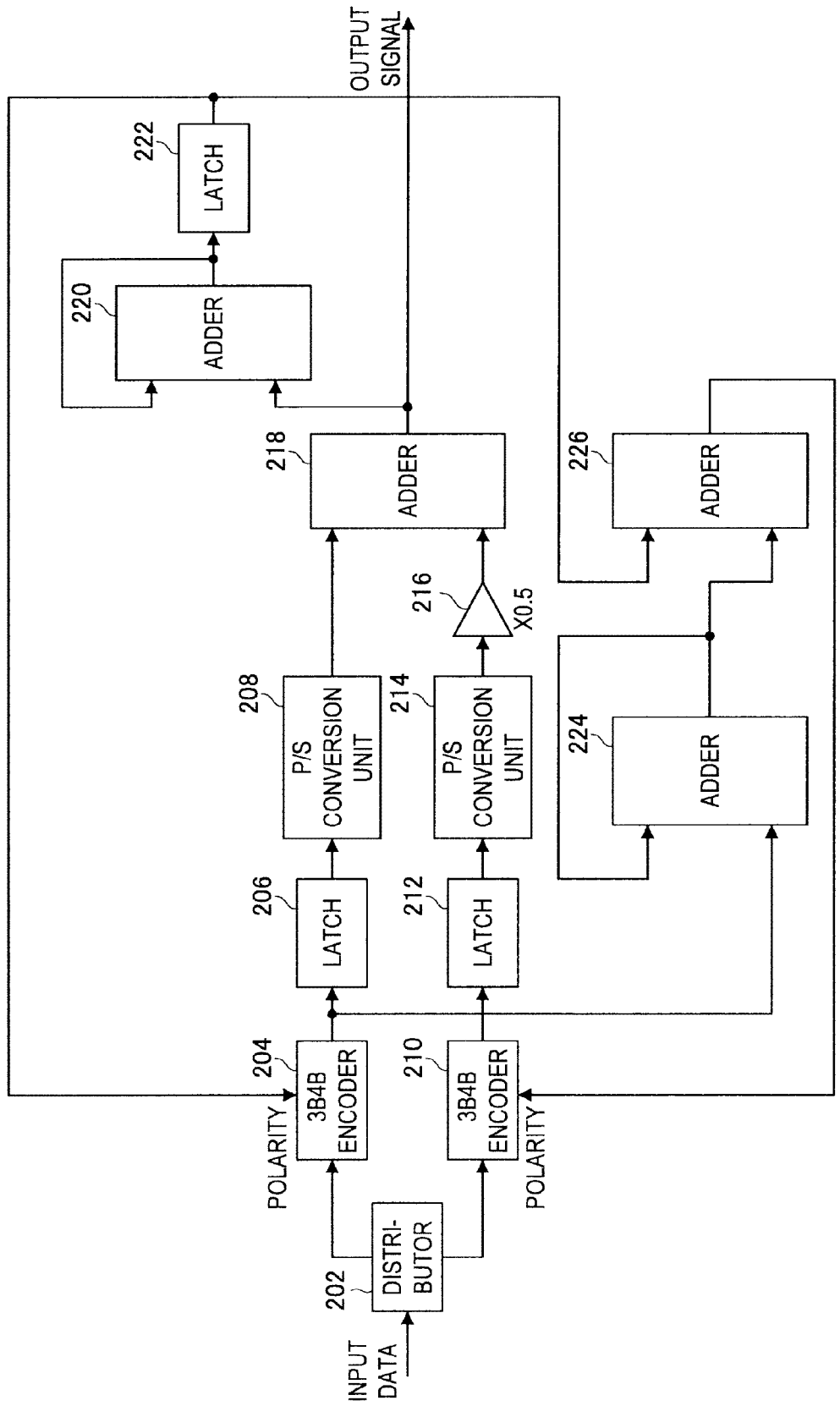

FIG. 9

(CONVERSION/REVERSE-CONVERSION TABLE)

| Data | S1 | S2 | S3 | S4 |
|---|---|---|---|---|
| 0 | -1 | -1 | -1 | +1 |
| 1 | -1 | -1 | +1 | -1 |
| 2 | -1 | +1 | -1 | -1 |
| 3 | -1 | -1 | +1 | +1 |
| 4 | -1 | +1 | -1 | +1 |
| 5 | +1 | -1 | +1 | -1 |
| 6 | -1 | +1 | +1 | -1 |
| 7 | +1 | -1 | -1 | +1 |

AMI CODE SPECTRUM

QUATERNARY CODE SPECTRUM

BINARY CODE SPECTRUM

TERNARY CODE (A + B) SPECTRUM

INFORMATION PROCESSING APPARATUS, AND SIGNAL PROCESSING METHOD

BACKGROUND OF THE INVENTION

1. Field of the Invention

The present invention relates to an information processing apparatus, and a signal processing method.

2. Description of the Related Art

Most information processing apparatuses such as mobile phone and notebook personal computer (hereinafter, a notebook PC) use a movable member for a hinge portion connecting a main body to be operated by a user and a display portion on which information is displayed. However, a large number of signal lines and power lines pass through the hinge portion, and a method for maintaining reliability of the wiring is desired. Reducing the number of the signal lines passing through the hinge portion comes first to mind Therefore, data transmission processing between the main body and the display portion is made to be performed by a serial transmission method instead of a parallel transmission method. As such, if the serial transmission method is used, the number of signal lines is reduced.

In the serial transmission method, data is encoded and then transmitted. At that time, for example, a Non Return to Zero (NRZ) encoding scheme, a Manchester encoding scheme, an Alternate Mark Inversion (AMI) encoding scheme, or the like is used as the encoding scheme. For example, JP-A-1991-109843 discloses a technology for transmitting data by using an AMI code, which is a representative example of a bipolar code. The patent document also discloses a technology according to which a data clock is transmitted after being expressed by an intermediate value of a signal level, and the receiving side regenerates the data clock based on the signal level.

SUMMARY OF THE INVENTION

However, in an information processing apparatus such as a notebook PC, even if the serial transmission method using the above code is used, the number of signal lines wired in the hinge portion is still large. For example, in a case of a notebook PC, there are wiring lines related to an LED backlight for illuminating an LCD in addition to wiring lines related to video signals to be transmitted to the display portion, and thus several tens of signal lines including these signal lines are wired in the hinge portion. The LCD is an abbreviation for Liquid Crystal Display, and the LED is an abbreviation for Light Emitting Diode.

For the reason described above, an encoding scheme (hereinafter, a new scheme) according to which a DC component is not included and according to which a clock component can be easily extracted from a received signal has been developed. Since a transmission signal generated based on this new scheme does not include a DC component, it can be transmitted by being superimposed on a DC power. Furthermore, by detecting a polarity inversion cycle of the transmission signal, a clock can be regenerated by the receiving side without using a PLL. Therefore, a plurality of signal lines can be bound together, and thereby the number of signal lines can be reduced and also the power consumption and the circuit scale can be reduced. The PLL is an abbreviation for Phase Locked Loop.

Now, in recent years, the resolution of the LCD is greatly enhanced as applications are diversified. Accordingly, together with the reduction of power consumption as described above, speeding up of transmission speed is also a large issue. Speeding up of transmission speed can be realized by simply speeding up the clock. However, if the clock is sped up in a serial transmission line, the frequency spectrum of the transmission signal becomes wide, resulting in EMI to the mobile phone or the like. Also, speeding up of the clock will increase the power consumption. The EMI is an abbreviation for Electromagnetic Interference.

Therefore, an encoding method that is capable of transmitting more data without increasing a clock frequency is desired. Also, in a case of transmitting the transmission signal by superimposing the same on a DC power as described above, since the signal is transmitted through a transmission line having DC cutoff characteristics, an encoding method that is capable of adjusting a DC balance of the transmission signal to be in a good state is preferable. In light of the foregoing, it is desirable to provide an information processing apparatus and a signal processing method, which are new and improved, and which are capable of keeping a frequency band used for data transmission narrow and increasing data transmission speed.

According to an embodiment of the present invention, there is provided an information processing apparatus which includes a distributor that distributes input data in units of M bits and generates N M-bit bit sequences, an encoding unit that converts each of the N tbit sequences distributed by the distributor into a binary symbol sequence of K symbols and generates N binary symbol sequences, a signal generation unit that generates N transmission signals Sj (j=1 to N) synchronized with a specific symbol clock and having, as an amplitude value, each symbol value included in the N binary symbol sequences, a signal delay unit that delays, with regard to j (j=1 to N), the transmission signals Sj generated by the signal generation unit by a (j−1)/N-symbol period and generates delay signals Rj, a signal addition unit that adds the delay signals Rj (j=1 to N) generated by the signal delay unit and generates an added signal, and a signal transmitting unit that transmits the added signal generated by the signal addition unit.

The information processing apparatus may further include a signal receiving unit that receives the added signal transmitted by the signal transmitting unit, an amplitude detection unit that sequentially detects, every 1/N-symbol period, an amplitude value of the added signal, a symbol value calculation unit that calculates each symbol value included in the N binary symbol sequences based on the amplitude value of the added signal detected by the amplitude detection unit, a decoding unit that converts the N binary symbol sequences including each symbol value calculated by the symbol value calculation unit into the M-bit bit sequences and decodes the N bit sequences, and a data restoration unit that combines the N bit sequences decoded by the decoding unit and restores the input data.

Symbol values located at beginning of the binary symbol sequences may be set to a same specific value for all the N binary symbol sequences. The symbol value calculation unit may calculate each symbol value included in the N binary symbol sequences by detecting a change in the amplitude value of the added signal detected by the amplitude detection unit, and, in a case there is a change, setting, as a current symbol value, a symbol value inverted from a previous symbol value included in a same binary symbol sequence and, in a case there is no change, sequentially repeating a process of setting, as the current symbol value, a symbol value same as the previous symbol value included in the same binary symbol sequence.

The encoding unit may convert the M-bit bit sequence into the binary symbol sequence of K symbols whose DC component is suppressed.

Symbol values located at beginning of the binary symbol sequences may be set to a same specific value for all the N binary symbol sequences. The signal transmission unit may add a synchronization signal before the added signal and transmit the added signal to which the synchronization signal has been added. At a part following the synchronization signal, the symbol value calculation unit may calculate an amplitude value $A(1, 1)$ at a first symbol period of the transmission signal S1 based on an amplitude value $X(1)$ detected first by the amplitude detection unit, calculate an amplitude value $A((p+1), 1)$ at a first symbol period of the transmission signal SL based on an amplitude value $X(L)$ detected L-th ($2 \leq L \leq N$) by the amplitude detection unit and an amplitude value $A(p, 1)$ ($p=1$ to $L-1$), calculate an amplitude value $A(1, (Q+1))$ at a $(Q+1)$-th symbol period of the transmission signal S1 based on an amplitude value $X(Q*N+1)$ detected $(Q*N+1)$-th ($1 \leq Q \leq K-1$) by the amplitude detection unit and an amplitude value $A(p, q)$ ($p=1$ to N, $q=1$ to Q), and calculate an amplitude value $A(L', (Q+1))$ at a $(Q+1)$-th symbol period of the transmission signal SL' based on an amplitude value $X(Q*N+L')$ detected $(Q*N+L')$-th ($2 \leq L' \leq N$) by the amplitude detection unit, the amplitude value $A(p, q)$ ($p=1$ to N, $q=1$ to Q) and an amplitude value $A(p', (Q+1))$ ($p'=1$ to $L'-1$).

The information processing apparatus may further include an arithmetic processing unit that outputs image data, and a display unit that displays the image data. The input data may be the image data that is output from the arithmetic processing unit. The display unit may display the image data restored by the data restoration unit.

According to another embodiment of the present invention, there is provided a signal processing method which includes the steps of distributing input data in units of M bits and generating N M-bit bit sequences, converting each of the N bit sequences distributed in the step of distributing into a binary symbol sequence of K symbols and generating N binary symbol sequences, generating N transmission signals Sj ($j=1$ to N) synchronized with a specific symbol clock and having, as an amplitude value, each symbol value included in the N binary symbol sequences, delaying, with regard to j ($j=1$ to N), the transmission signals Sj generated in the step of generating by a $(j-1)/N$-symbol period and generating delay signals Rj, and adding the delay signals Rj ($j=1$ to N) generated in the step of delaying and generating an added signal.

According to another embodiment of the present invention, there is provided an information processing apparatus which includes a distributor that distributes input data in units of M bits and generates two M-bit bit sequences, an encoding unit that converts each of the two bit sequences distributed by the distributor into a binary symbol sequence of K symbols and generates first and second binary symbol sequences, a signal generation unit that generates a first transmission signal having, as an amplitude value, each symbol value included in the first binary symbol sequence and a second transmission signal having, as an amplitude value, each symbol value included in the second binary symbol sequence, an amplitude adjusting unit that adjusts the amplitude value of the first transmission signal generated by the signal generation unit to $1/K$ (K is a natural number), a signal addition unit that synchronously adds the first transmission signal whose amplitude value has been adjusted by the amplitude adjusting unit and the second transmission signal generated by the signal generation unit and generates an added signal, and a signal transmitting unit that transmits the added signal generated by the signal addition unit.

The information processing apparatus may further include a signal receiving unit that receives the added signal transmitted by the signal transmitting unit, an amplitude determination unit that determines, in a case the amplitude value of the first transmission signal adjusted by the amplitude adjusting unit is A or $-A$ and the amplitude value of the second transmission signal is B or $-B$ ($A=B/K$), an amplitude value of the added signal received by the signal receiving unit by using a plurality of threshold values for distinguishing between a first amplitude value ($B+A$), a second amplitude value ($B-A$), a third amplitude value ($-B+A$) and a fourth amplitude value ($-B-A$), a symbol sequence restoration unit that detects the amplitude values of the first and second transmission signals based on a result of determination by the amplitude determination unit and restores the first and second binary symbol sequences, a decoding unit that converts the first and second binary symbol sequences restored by the symbol sequence restoration unit into the two bit sequences, and a data restoration unit that combines the two bit sequences obtained by conversion by the decoding unit and restores the input data.

The encoding unit may convert the M-bit bit sequence into the binary symbol sequence of K symbols whose DC component is suppressed.

The information processing apparatus may further include an arithmetic processing unit that outputs image data, and a display unit that displays the image data. The input data may be the image data that is output from the arithmetic processing unit. The display unit may display the image data restored by the data restoration unit.

According to another embodiment of the present invention, there is provided a signal processing method which includes the steps of distributing input data in units of M bits and generating two M-bit bit sequences, converting each of the two bit sequences distributed in the step of distributing into a binary symbol sequence of K symbols and generating first and second binary symbol sequences, generating a first transmission signal having, as an amplitude value, each symbol value included in the first binary symbol sequence and a second transmission signal having, as an amplitude value, each symbol value included in the second binary symbol sequence, adjusting the amplitude value of the first transmission signal generated in the step of generating to $1/K$ (K is a natural number), and synchronously adding the first transmission signal whose amplitude value has been adjusted in the step of adjusting and the second transmission signal generated in the step of generating and generating an added signal.

According to the embodiments of the present invention described above, it is possible to increase data transmission speed while keeping a frequency band used for data transmission narrow.

BRIEF DESCRIPTION OF THE DRAWINGS

FIG. 7A is an explanatory diagram for describing 8B6 T conversion (contents of an 8B6 T conversion table);

FIG. 7B is an explanatory diagram for describing 8B6 T conversion (contents of an 8B6 T conversion table);

FIG. 7C is an explanatory diagram for describing 8B6 T conversion (contents of an 8B6 T conversion table);

FIG. 7D is an explanatory diagram for describing 8B6 T conversion (contents of an 8B6 T conversion table);

FIG. 8 is an explanatory diagram showing an example of a configuration of a transmitting side capable of realizing an encoding method according to a first embodiment of the present invention;

FIG. 9 is explanatory diagram showing an example of a configuration of a conversion/reverse-conversion table used for an encoding method according to the embodiment;

DETAILED DESCRIPTION OF THE EMBODIMENT(S)

Figure 1:
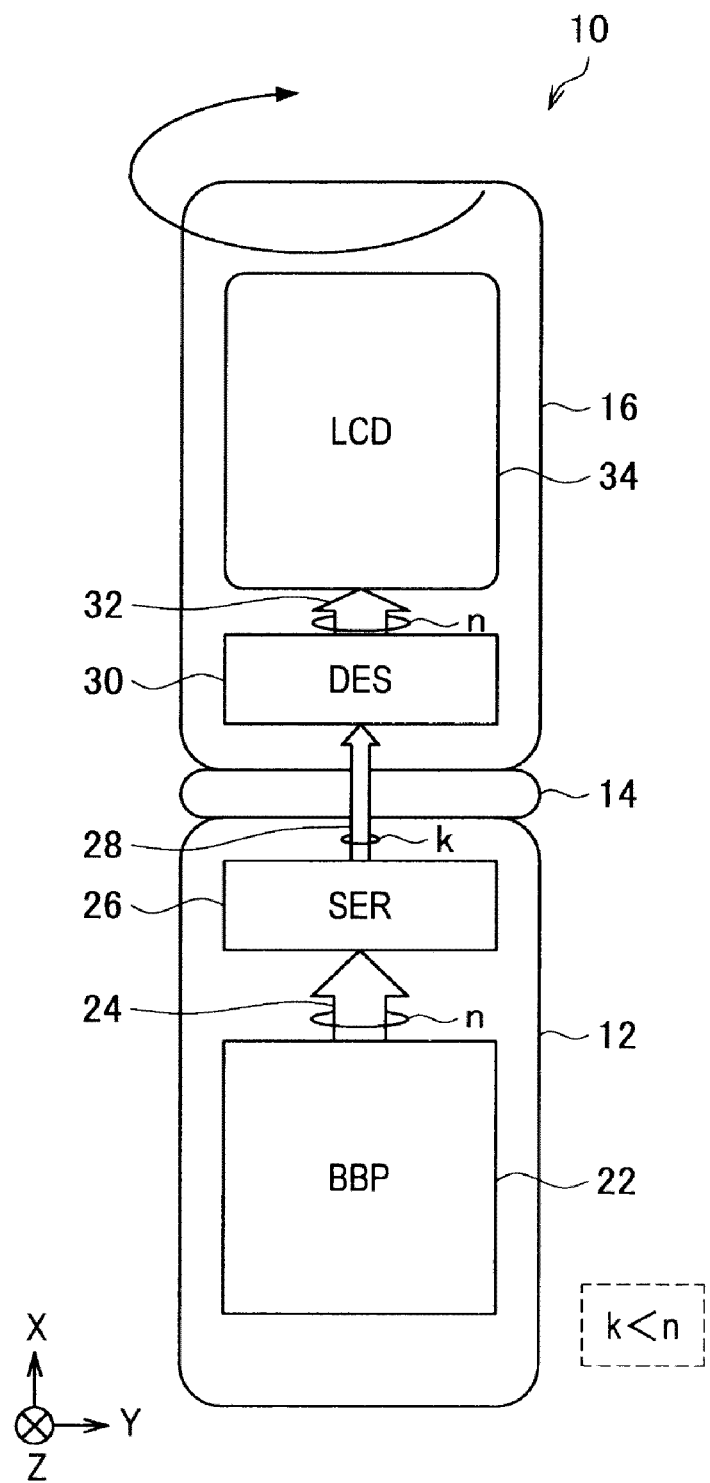
FIG. 1 is an explanatory diagram showing an example of a configuration of a mobile terminal adopting a serial transmission scheme.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

<Flow of Description>

The flow of a description of embodiments of the present invention described later will be briefly mentioned here. First, a device configuration of a mobile terminal 10 adopting a serial transmission scheme will be described with reference to FIG. 1. Next, a signal waveform of an AMI code and characteristics thereof will be described with reference to FIG. 2. Then, a functional configuration of a mobile terminal 10 according to a new scheme will be described with reference to FIG. 3. Then, an encoding method according to the new scheme and a frequency spectrum of a transmission signal obtained by the encoding method will be described with reference to FIGS. 4 and 5. Then, an encoding method based on an 8B6 T conversion scheme will be described with reference to FIGS. 6 to 7C.

Next, an encoding method according to a first embodiment of the present invention and a configuration of a transmitting side capable of realizing the encoding method will be described with reference to FIGS. 8 to 11B. Then, a decoding method according to the embodiment and a configuration of a receiving side capable of realizing the decoding method will be described with reference to FIGS. 9, 12 and 13. Then, an encoding method according to a second embodiment of the present invention and a configuration of a transmitting side capable of realizing the encoding method will be described with reference to FIGS. 14 to 16B. Then, a decoding method according to the embodiment and a configuration of a receiving side capable of realizing the decoding method will be described with reference to FIGS. 17 to 19.

Figure 20:
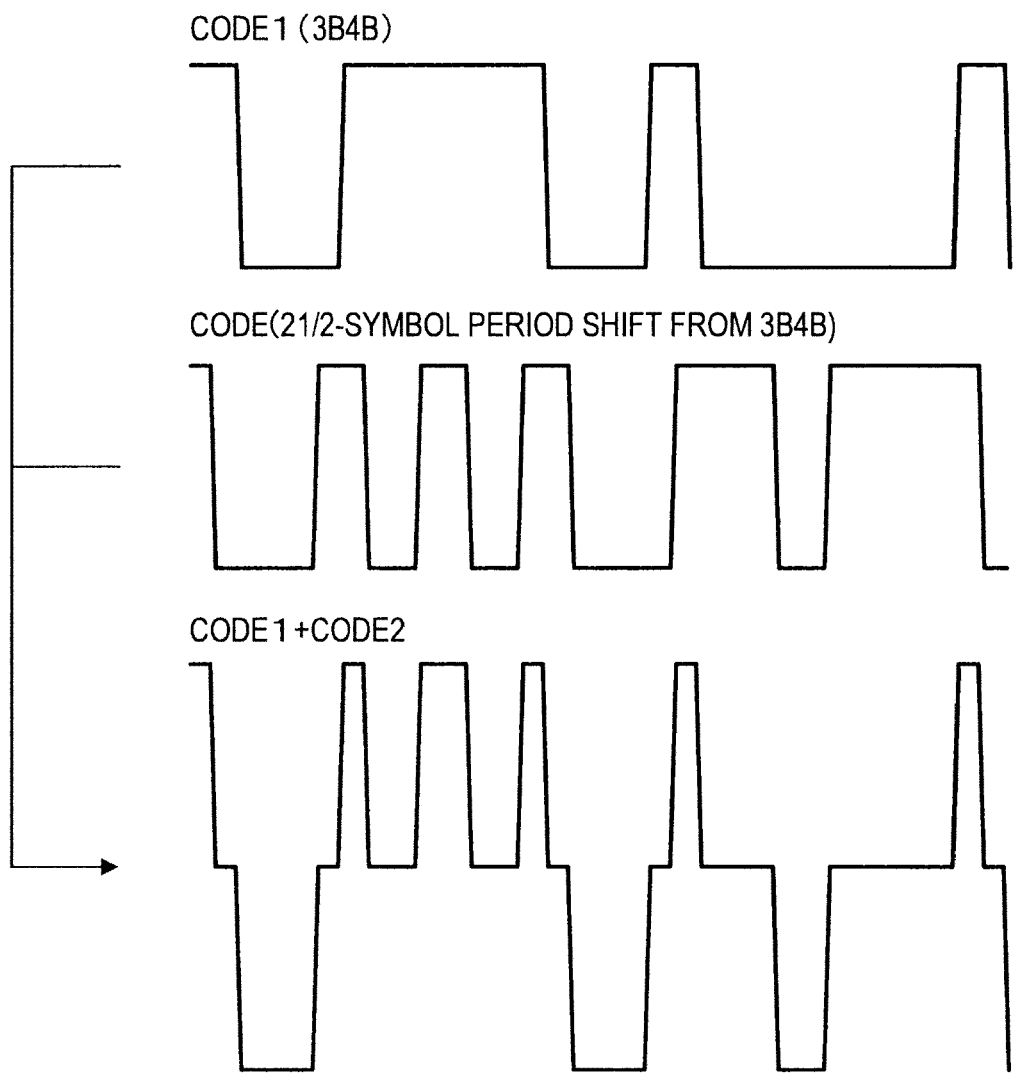
FIG. 20 is an explanatory diagram showing a point of an encoding method according to the first embodiment of the present invention.
Figure 21:
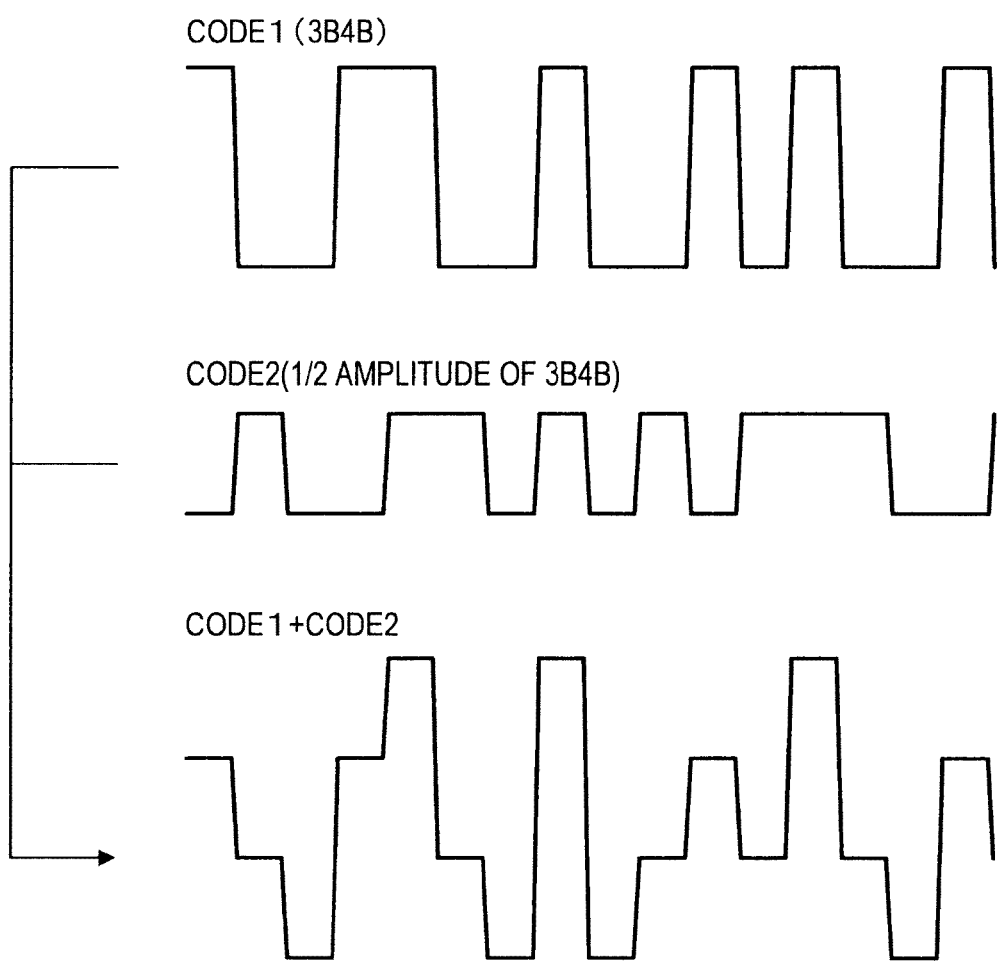
FIG. 21 is an explanatory diagram showing a point of an encoding method according to the second embodiment of the present invention.

Next, points of the encoding methods according to the first and second embodiments of the present invention will be summarized with reference to FIGS. 20 and 21. Lastly, technical ideas of the embodiments will be summarized by summarizing the expression, and operational effects obtained by the technical ideas will be briefly described.

(Description Items)
1: Introduction
  1-1: Serial Transmission Scheme
  1-2: New Scheme (Multilevel Transmission Scheme)
  1-3: 8B6 T Conversion Scheme
2: First Embodiment
  2-1: Encoding Method
  2-2: Decoding Method
3: Second Embodiment
  3-1: Encoding Method
  3-2: Decoding Method
  3-3: Modified Example
4: Summary
  4-1: Summary of Points
  4-2: Summary of Expression

1: Introduction

In the following, a detailed explanation will be given on the technology according to an embodiment of the present invention. But before giving the explanation, a serial transmission scheme to which the technology of the embodiment can be applied and the new scheme described above will be described.

1-1: Serial Transmission Scheme

First, a device configuration of a mobile terminal 10 adopting a serial transmission scheme will be briefly described with reference to FIG. 1. FIG. 1 is an explanatory diagram showing an example of a device configuration of the mobile terminal 10 adopting a serial transmission scheme.

In FIG. 1, a mobile phone is schematically illustrated as an example of the mobile terminal 10. However, the application scope of the technology described below is not limited to a mobile phone. For example, it can be applied to an information processing apparatus such as a notebook PC or various portable electronic devices. Also, in the following explanation, a case where image data is transmitted will be described as an example, but the type of a signal to be transmitted is not limited to such. For example, a signal of control data, audio data or the like may also be transmitted.

As shown in FIG. 1, the mobile terminal 10 mainly includes an operation unit 12, a hinge part 14, and a display unit 16. The operation unit 12 includes a baseband processor 22 (BBP), a parallel signal line 24, and a serializer 26. A serial signal line 28 is arranged in the hinge part 14. Furthermore, the display unit 16 mainly includes a deserializer 30, a parallel signal line 32, and a liquid crystal unit 34 (LCD). The LCD is an abbreviation for Liquid Crystal Display.

The liquid crystal unit 34 is provided on the display unit 16. The liquid crystal unit 34 is an example of display means for displaying image data. The LCD is indicated as an example here, but the type of the display means provided on the display unit 16 is not limited to such. For example, the display means provided on the display unit 16 may be an OELD (Organic Electroluminescent Display), a PDP (Plasma Display Panel), or the like.

Furthermore, the hinge part 14 is formed from a member (hereinafter, connecting member) connecting the display unit 16 and the operation unit 12. This connecting member has a movable structure that allows the display unit 16 to rotate 180 degrees in Z-Y plane, or to rotate in an X-Z plane, for example. Furthermore, this connecting member may also have a movable structure that allows the display unit 16 to be arranged in any direction.

Furthermore, the baseband processor 22 is an example of an arithmetic processing unit that provides the mobile terminal 10 with a communication control function and an application execution function. The baseband processor 22 outputs control data, image data and the like in the form of a parallel signal. For example, a parallel signal of image data is transmitted to the display unit 16, and is used for image display on the liquid crystal unit 34. When such parallel signal is to be transmitted as it is, a large number of signal lines will be necessary. For example, the number of parallel signal lines used for image display by a general mobile phone is about fifty.

Therefore, in a case of a general folding mobile phone adopting a parallel transmission scheme, approximately fifty parallel signal lines are wired in the hinge portion. Accordingly, the movable range of the hinge portion is, in many cases, limited to one direction. If rotation of 180 degrees in a Z-Y plane is allowed as with the mobile terminal 10 shown in FIG. 1, a twisting force or a pulling force is applied on the approximately fifty parallel signal lines in the hinge portion, and if the force is strong, the parallel signal lines will break. Accordingly, in the case of a general folding mobile phone adopting the parallel transmission scheme, the movable range of the hinge portion is limited.

However, a modification for enlarging the movable range of the hinge portion while avoiding the risk of breaking of lines is desired in order to improve the design and the convenience of a user. In view of such issue, the mobile terminal 10 of a serial transmission scheme as shown in FIG. 1 has been devised. When transmitting a signal from the operation unit 12 to the display unit 16, the mobile terminal 10 converts a parallel signal into a serial signal and then transmits the same. Accordingly, the number of signal lines in the hinge part 14 of the mobile terminal 10 is significantly less than a general mobile phone adopting the parallel transmission scheme. In the following, a configuration of the mobile terminal 10 will be described in greater detail.

The mobile terminal 10 transmits data, such as image data, based on the serial transmission scheme, through the serial signal line 28 in the hinge part 14. Therefore, the serializer 26 is provided in the operation unit 12. The serializer 26 is for serializing a parallel signal output from the baseband processor 22. On the other hand, the deserializer 30 is provided in the display unit 16. The deserializer 30 is for parallelizing a serial signal transmitted through the serial signal line 28.

A parallel signal output from the baseband processor 22 is input to the serializer 26 via the parallel signal line 24. When the parallel signal is input, the serializer 26 serializes the input parallel signal, and generates a serial signal. The serial signal generated by the serializer 26 is input to the deserializer 30 via the serial signal line 28. When the serial signal is input, the deserializer 30 parallelizes the input serial signal, and generates a parallel signal. The parallel signal generated by the deserializer 30 is input to the liquid crystal unit 34 via the parallel signal line 32.

As described above, the serial signal line 28 is used for transmission of a data signal. Furthermore, the serial signal line 28 may also be used for transmitting together a data signal and a clock. The number k of lines of the serial signal line 28 is significantly less than the number n of lines of the parallel signal line in the hinge portion of a general mobile phone ($1 \leq k \ll n$). Furthermore, the number k of lines of the serial signal line 28 is reduced to approximately one in a case a scheme of superimposing the data signal and the clock on a power line and transmitting the same (for example, the new scheme described above) is used.

As described, when adopting the serial transmission scheme, the number of signal lines in the hinge part 14 can be greatly reduced compared to the case of adopting the parallel transmission scheme used by a general mobile phone. With the number of signal lines in the hinge part 14 being reduced, the movable range of the hinge part 14 can be enlarged while maintaining the reliability of the signal line. For example, when the number of signal lines is reduced to approximately one, the signal line is less likely to be, for example, twisted or pulled at the time the hinge part 14 is transformed, and the risk of the signal line breaking is greatly reduced.

Heretofore, a device configuration of the mobile terminal 10 has been briefly described. The configuration of the mobile terminal 10 adopting the serial transmission scheme is basically as described above. As described above, the number of signal lines in the hinge part 14 can be reduced by adopting the serial transmission scheme. However, the number of signal lines depends on the characteristics of a signal passing through the serial signal line 28 and the transmission method. For example, in the case of a transmission scheme of superimposing a data signal not including a DC component on a power line and transmitting the same, a data line and the power line can be bound together to 1 or 2 lines.

Incidentally, in many cases, a data signal flowing through the serial signal line 28 is encoded. That is, when transmitting data, the mobile terminal 10 encodes and converts data into encoded data, and transmits a data signal generated based on the encoded data through the serial signal line 28. Also, the mobile terminal 10 detects, by using a comparator, an amplitude value of the data signal transmitted through the serial signal line 28, and restores the encoded data. Furthermore, the mobile terminal 10 decodes the encoded data and restores the original data.

A clock used at the time of generation of the encoded data is used for a decoding process for the encoded data. This clock is normally regenerated from the data signal by using a PLL. However, an encoding method (new scheme) that is capable of regenerating a clock from a data signal without a use of a PLL has recently been devised. When using this encoding method, it becomes unnecessary to provide a PLL at a receiving side (for example, the display unit 16) of the data signal, and power consumption can be reduced. Also, since a PLL is not provided, a circuit scale can be reduced to that extent. With a small electronic device such as the mobile terminal 10, low power consumption is strongly desired, and thus use of the encoding method of the new scheme is desired.

1-2: New Scheme (Multilevel Transmission Scheme)

Here, the encoding method of the new scheme will be briefly described with reference to FIGS. 2 to 4. Additionally, in the following, a concrete explanation will be given on an encoding method of the new scheme for which an AMI code serves as a base. However, the type of a code that can be applied to the encoding method of the new scheme is not limited to the AMI code. For example, a partial response code, a Manchester code, a CMI code, other bipolar code and biphase code, and the like can also be applied.

(Signal Waveform of AMI Code)

First, the AMI code will be briefly described. A signal waveform of the AMI code and characteristics of the AMI code will be briefly described with reference to FIG. 2. FIG. 2 is an explanatory diagram showing an example of the signal waveform of the AMI code. The AMI code is obtained by expressing a data value of zero by an electrical potential of zero and a data value of 1 by potentials of A and −A (A is any positive number). Note, however, that the potential A and the potential −A are used alternately. That is, after a data value of 1 has been expressed by the potential A, if the next data bit is also a 1, that 1 will be expressed by the potential −A. Because the data values are expressed by repeatedly inverting the polarity in this manner, the AMI code will be a code that hardly contains DC components.

Other codes with the same type of characteristics as the AMI code include, for example, the partial response code that expresses the data as PR(1, −1), PR(1, 0, −1), PR(1, 0, . . . , −1), and the like. Transmission codes that expresses data by using polarity inversion in this manner are called bipolar codes. Alternatively, a dicode code, a biphase code, or the like, can also be used for the encoding method of the new scheme described later. Note that, in the following explanation, an encoding method based on an AMI code with a duty of 100% will be described as an example.

Figure 2:
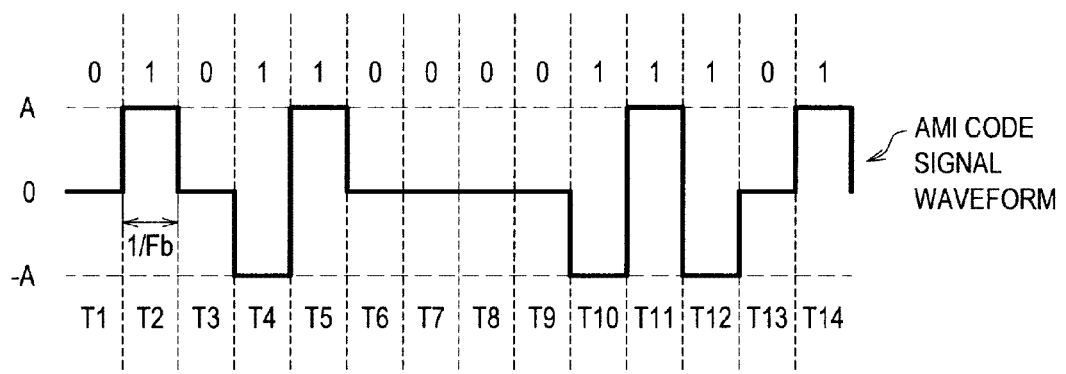
FIG. 2 is an explanatory diagram showing a signal waveform of an AMI code.

FIG. 2 schematically shows the AMI code of periods T1 to T14. In the drawing, a data value 1 appears at timings T2, T4, T5, T10, T11, T12, and T14. If the potential is A at timing T2, the potential at timing T4 will be −A. Also, the potential at timing T5 will be A. As such, the amplitude corresponding to the data value 1 is alternately inverted between positive and negative values. Additionally, the characteristic of alternately inverting between positive and negative values is referred to as polarity inversion. In contrast, a data value 0 is expressed by a potential 0 at all times.

This form of expression allows the AMI code to be a code that hardly contains DC components. However, as can be seen at timings T6 to T9, there may appear a section where a potential of 0 occurs consecutively, depending on the combination of data. The consecutive potentials of 0 make it difficult to extract the clock component from the signal waveform without using a PLL. That is, it becomes necessary to provide a PLL at the receiving side. In view of such issue, a method of superimposing a clock on the AMI code (or a code having equivalent characteristics) and transmitting the same has been devised (encoding method of the new scheme).

(Functional Configuration of Mobile Terminal 10)

Hereunder, a functional configuration of the mobile terminal 10 according to the new scheme will be described with reference to FIG. 3. FIG. 3 is an explanatory diagram showing an example of a functional configuration of the mobile terminal 10 according to the new scheme. However, it should be noted that FIG. 3 is an explanatory diagram mainly illustrating functional configurations of the serializer 26 and the deserializer 30, and that description of other structural elements are omitted.

(Serializer 26)

First, the serializer 26 will be described. As shown in FIG. 3, the serializer 26 is configured from a P/S conversion unit 102, an encoder 104, a driver 106, a PLL unit 108, and a timing control unit 110.

Figure 3:
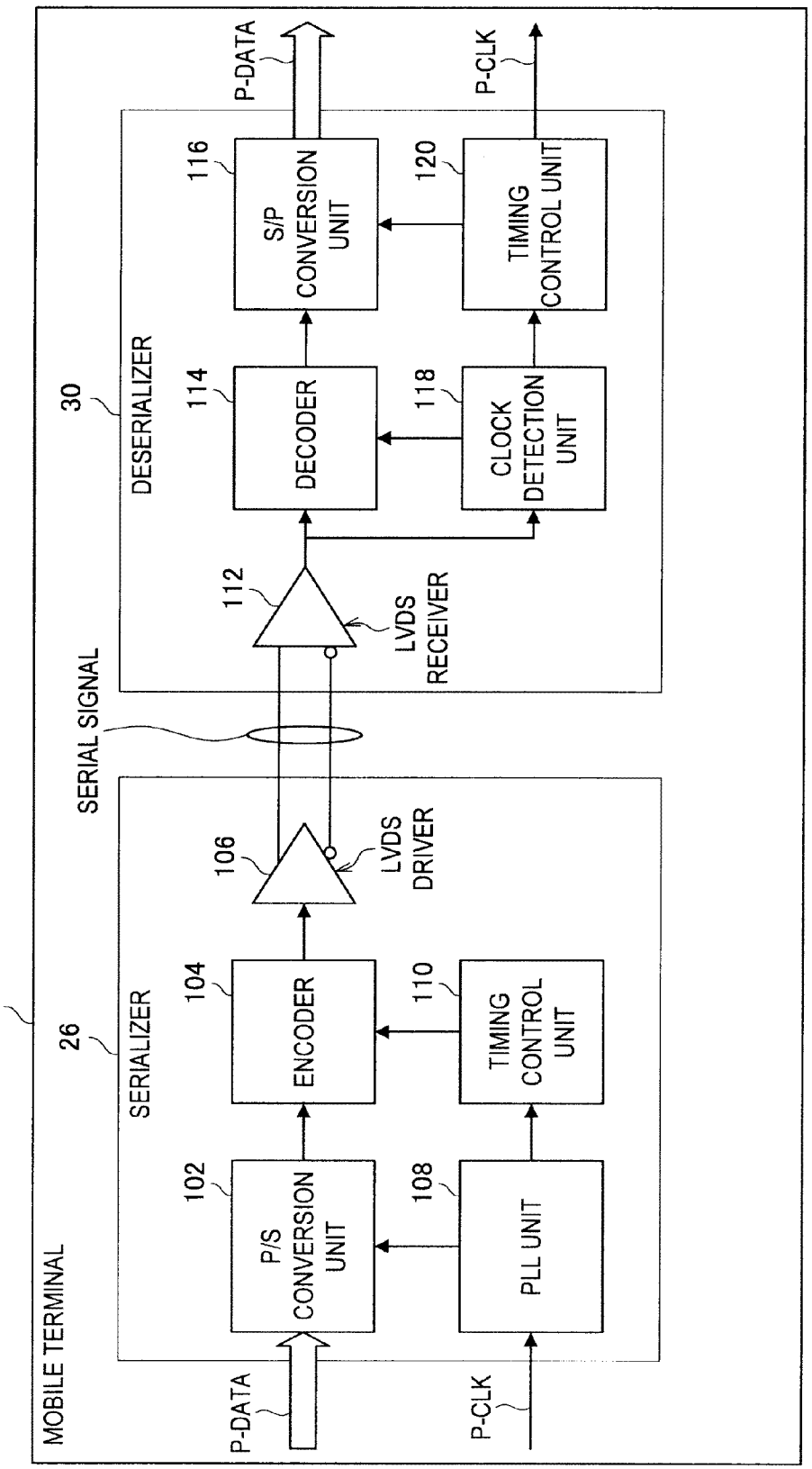
FIG. 3 is an explanatory diagram showing an example of a functional configuration of a mobile terminal 10 according to a new scheme.

As shown in FIG. 3, a parallel signal (P-DATA) and a parallel signal clock (P-CLK) are input from the baseband processor 22 to the serializer 26. The parallel signal that is input to the serializer 26 is converted into a serial signal by the P/S conversion unit 102. The serial signal that has been converted by the P/S conversion unit 102 is input to the encoder 104. The encoder 104 adds a header and the like to the serial signal and generates a transmission frame. Furthermore, the encoder 104 encodes the generated transmission frame by the encoding method of the new scheme described later, and generates a transmission signal.

Next, a method of generating an encoded signal at the encoder 104 will be described with reference to FIG. 4. FIG. 4 is an explanatory diagram showing an example of the encoding method of the new scheme. Additionally, FIG. 4 illustrates an encoding method based on the AMI code. However, the type of a code that can be used for the encoding method of the new scheme is not limited to such, and other code having equivalent characteristics to the AMI code can be similarly used. For example, the encoding method of the new scheme can be applied to the bipolar code, the partial response code, and the like.

Figure 4:
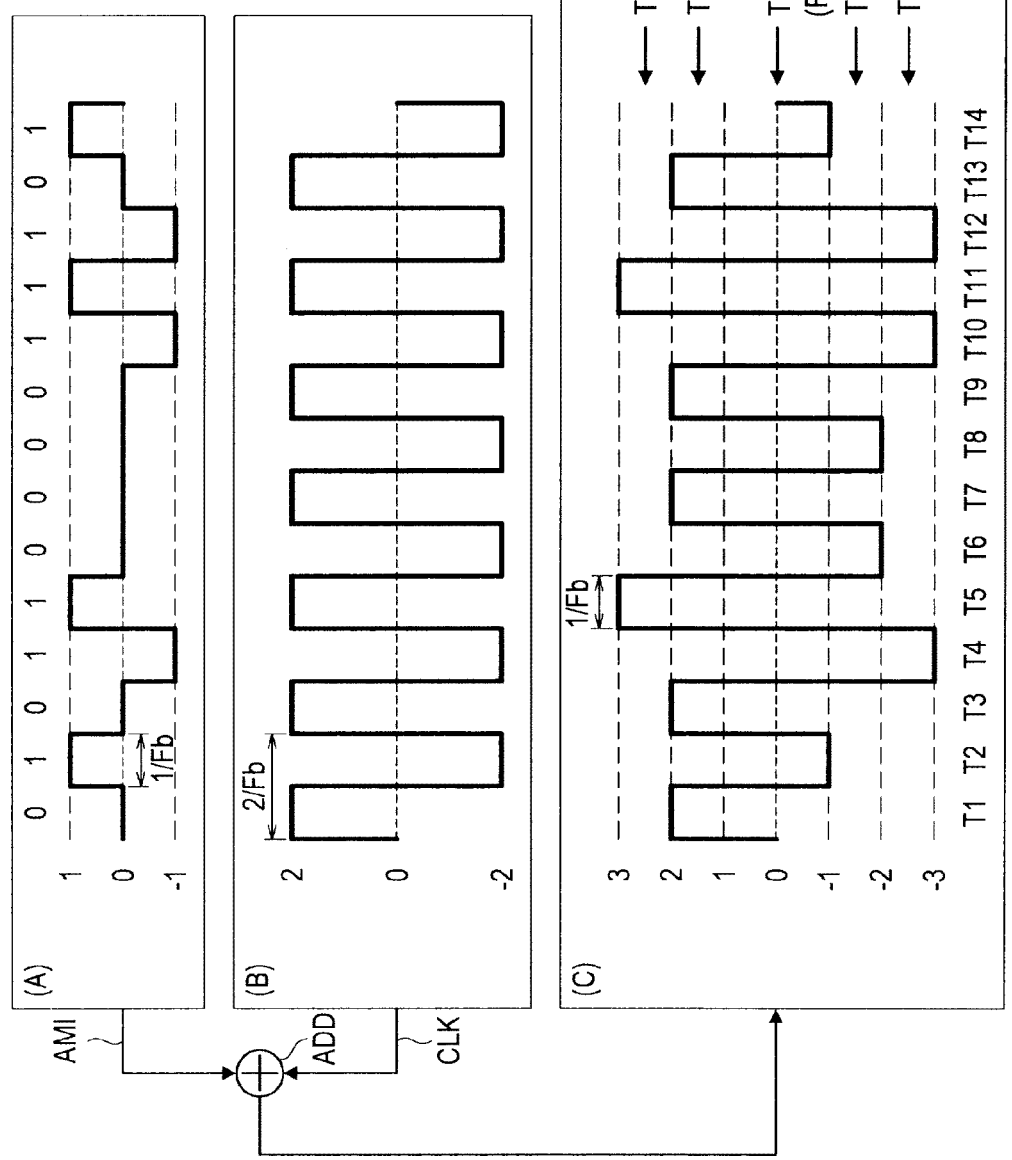
FIG. 4 is an explanatory diagram showing an example of an encoding method according to the new scheme.

The code waveform of (C) of FIG. 4 has been generated by the encoding method of the new scheme. This code waveform has been obtained by expressing a data value 1 by a plurality of potentials A1 (−1, −3, 1, 3) and a data value 0 by a plurality of potentials A2 (−2, 2) that are different from the potentials A1. The characteristics of this code waveform are that polarities are inverted every half cycle of the clock and that the same potential does not occur consecutively. For example, referring to the section where data values 0 occur consecutively in timings T6 to T9, the potentials are −2, 2, −2, 2. Accordingly, even if the same data values occur consecutively, the clock component can be detected without using a PLL by detecting both the rising and falling edges of the amplitude.

Such code waveform is obtained by a method of synchronously adding a clock as shown in (B) of FIG. 4 to a code waveform of an AMI code as shown in (A) of FIG. 4, for example. The encoder 104 includes an adder ADD to realize this method. First, the encoder 104 encodes a serial signal that has been input into an AMI code, and generates a code waveform of an AMI code as shown in (A) of FIG. 4. Next, the encoder 104 inputs the code waveform of the AMI code that has been generated to the adder ADD. Furthermore, the encoder 104 generates a clock as shown in (B) of FIG. 4, and inputs the same to the adder ADD.

Here, as shown in (B) of FIG. 4, the clock has a frequency (Fb/2) half that of the transmission speed Fb of the AMI code.

Furthermore, the amplitude of this clock is N times that of the AMI code (N>1; N=2 in the example in FIG. 4). As described, by adding together the AMI code and the clock having an amplitude larger than the amplitude of the AMI code, a code waveform whose amplitude crosses zero every half cycle of the clock, as shown in (C) of FIG. 4, can be obtained. At this time, the code waveform of the AMI code and the clock are synchronously added with their edges aligned. The code waveform (the transmission signal) of the new scheme is generated by the encoder 104 in this manner.

Figure 5:
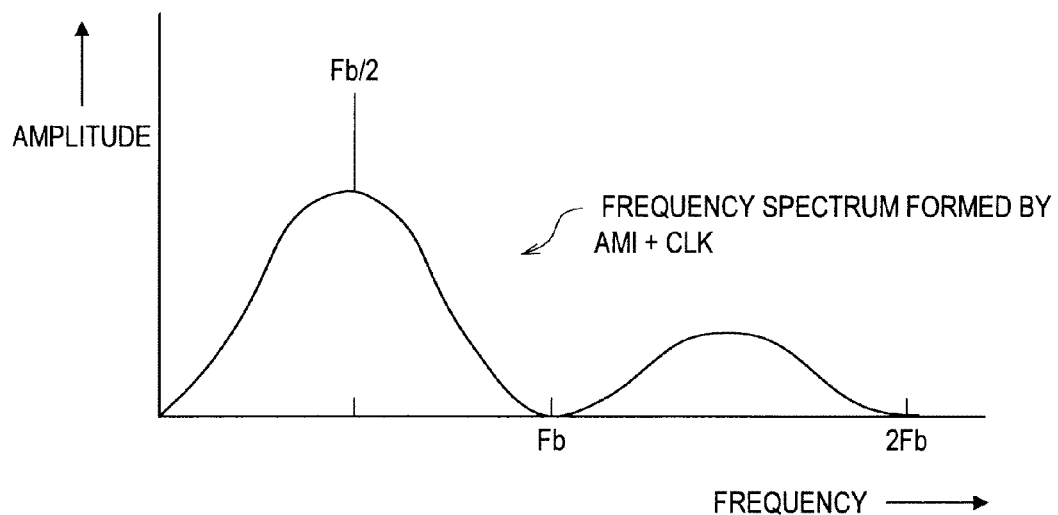
FIG. 5 is an explanatory diagram showing an example of a frequency spectrum of a multilevel signal obtained by using an encoding method according to the new scheme.

Additionally, the code waveform of the new scheme has a plurality of amplitude levels for one data value. For example, the code waveform of the new scheme illustrated in (C) of FIG. 4 may take six values, 3, 2, 1, −1, −2, and −3, as the amplitude level. Among these, 2 and −2 correspond to a data value 0, and 3, 1, −1, and −3 correspond to a data value 1. That is, the code of the new scheme is a multilevel code (a senary code in the example of FIG. 4). Also, the frequency spectrum of the code waveform of the new scheme will take a form as shown in FIG. 5. As described above, the code of the new scheme contains the clock component, and thus the frequency spectrum also includes a line spectrum at the position of clock frequency Fb/2.

Heretofore, the encoding method of the encoder 104 and the characteristics of the code waveform generated by the encoder 104 have been described. Additionally, to simplify the explanation, a method has been described here of generating the code waveform of the new scheme by synchronously adding the AMI code and the clock. However, there is also a method of directly encoding data into the code waveform of the new scheme based on a specific coding rule. For example, in the example of FIG. 4, amplitude levels 2, −1, 2, −3, 3, −2, . . . , −1 are determined from a data sequence 0, 1, 0, 1, 1, 0, . . . , 1 based on a specific coding rule, and the code waveform of the new scheme is generated based on the determination result.

FIG. 3 will be again referred to. The serial signal that has been encoded by the encoder 104 in the manner described above is input to the driver 106. The driver 106 transmits the input serial signal to the deserializer 30 by a differential transmission scheme according to LVDS. On the other hand, the parallel signal clock input to the serializer 26 is input to the PLL unit 108.

The PLL unit 108 generates a serial signal clock from the parallel signal clock, and inputs the serial signal clock to the P/S conversion unit 102 and the timing control unit 110. The timing control unit 110 controls the timing of transmission of the serial signal by the encoder 104, based on the input serial signal clock. A serial signal is transmitted from the serializer 26 to the deserializer 30 in the manner described above.

(Deserializer 30)

Next, the deserializer 30 will be described. As shown in FIG. 3, the deserializer 30 is mainly configured from a receiver 112, a decoder 114, an S/P conversion unit 116, a timing control unit 120, and a clock detection unit 118. Additionally, the clock detection unit 118 does not have a PLL.

Now, a serial signal is transmitted from the serializer 26 to the deserializer 30 by the differential transmission scheme according to LVDS. This serial signal is received by the receiver 112. The serial signal received by the receiver 112 is input to the decoder 114 and the clock detection unit 118. The decoder 114 detects the beginning portion of data by referring to the header of the input serial signal and decodes the serial signal that was encoded by the encoder 104.

Here, a decoding method of the decoder 114 will be described by referring again to FIG. 4. As described above, the serial signal is encoded by the encoder 104 into a code waveform having six amplitude levels. Thus, the decoder 114 performs threshold determination with a plurality of threshold levels as references, and compares each amplitude level. Then, by converting each amplitude level obtained by the threshold determination into the original data, the decoder 114 decodes the serial signal that has been encoded by the encoder 104.

For example, by using four threshold values (L1, L2, L3, L4) that are shown in (C) of FIG. 4, amplitude level A1 (−1, −3, 1, 3), which corresponds to a data value 1, and amplitude level A2 (−2, 2), which corresponds to a data value 0, can be distinguished from each other. The decoder 114 first compares the amplitude level of the input signal with the four threshold values described above and determines whether the amplitude level is A1 or A2. Then, the decoder 114 decodes the serial signal that has been encoded by the encoder 104, by outputting a data value 1 at a timing the amplitude level is determined to be A1 and outputting a data value 0 at a timing the amplitude level is determined to be A2.

FIG. 3 will be again referred to. The serial signal that has been restored by the decoder 114 in this manner is input to the S/P conversion unit 116. The S/P conversion unit 116 converts the input serial signal into a parallel signal (P-DATA). The parallel signal that has been converted by the S/P conversion unit 116 is input to the liquid crystal unit 34. In a case the parallel signal is an image signal, an image is displayed by the liquid crystal unit 34 based on the image signal.

Now, a clock becomes necessary to perform the above-described decoding process. This clock is supplied by the clock detection unit 118. The clock detection unit 118 detects a clock component in the signal received by the receiver 112. Then, the clock detection unit 118 regenerates the original clock by using the detected clock component. As has already been explained, the code waveform of the new scheme is obtained by synchronously adding a clock to the AMI code. And the polarity of this code waveform is inverted every half cycle of the clock. Thus, the clock component is obtained by detecting the timing of the amplitude level of a received signal crossing zero. That is, the clock detection unit 118 can regenerate the clock without using a PLL. Accordingly, a PLL does not have to be provided, and the power consumption and the circuit scale of the deserializer 30 can be reduced to that extent.

The clock detection unit 118 regenerates the original clock by using the clock component detected from the received signal. Then, the clock regenerated by the clock detection unit 118 is input to the decoder 114 and the timing control unit 120. The clock input to the decoder 114 is used for the decoding process by the decoder 114. Furthermore, the timing control unit 120 controls a reception timing based on the clock input from the clock detection unit 118. Furthermore, the clock input to the timing control unit 120 is converted into the parallel signal clock (P-CLK), and is output towards the liquid crystal unit 34.

The threshold determination process performed by the decoder 114 and the clock detection unit 118 is performed by using a comparator corresponding to each threshold value. For example, the clock detection unit 118 extracts the clock component based on the output result of a comparator having a threshold level L0. Also, to determine six amplitude levels, 3, 2, 1, −1, −2, and −3, the decoder 114 uses four comparators respectively with threshold levels, L1 (2.5), L2 (1.5), L3 (−1.5), and L4 (−2.5). The amplitude levels are determined based on the output results of these comparators. Furthermore, the original NRZ data is restored based on the determination results.

As described above, using a code of the new scheme which does not contain a DC component and from which a clock component can be detected based on the polarity inversion cycle allows the deserializer 30 to perform clock detection without using a PLL, and thus the power consumption of the mobile terminal 10 is greatly reduced. Additionally, the above-described example illustrates a differential transmission scheme according to LVDS. However, transmission is also possible by superimposing the code waveform of the new scheme on a power signal supplied from a DC power supply. According to this configuration, the movable range of the hinge part 14 can be further increased.

(Summary of Issues)

As described above, the transmission signal generated by the encoding method of the new scheme is a multilevel signal. Furthermore, since binary data (NRZ data) is converted into ternary data at the time of encoding the AMI code, one bit value is expressed by a plurality of amplitude levels and redundancy is increased. Even if the redundancy is increased in this manner, the transmission speed is not increased. Accordingly, the inventor of the present invention has devised a method of further increasing the transmission speed by making use of the redundancy of the multilevel signal.

1-3: 8B6T Conversion Scheme

Figure 6:
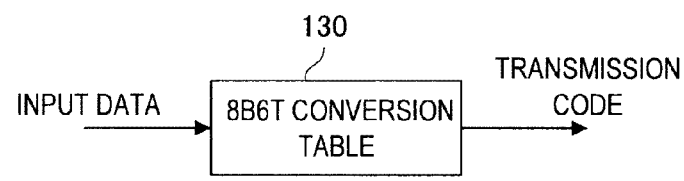
FIG. 6 is an explanatory diagram for describing 8B6 T conversion.

As a method of increasing transmission speed by using a multilevel signal, 8B6 T conversion scheme defined in IEEE 802.3u is known, for example. The 8B6T conversion scheme is for expressing 8-bit data by 6 ternary symbols and transmitting the 8-bit data in a 6-symbol period. Accordingly, when using 8B6 T conversion scheme, transmission speed can be increased by 4/3=1.33 times without increasing a clock frequency. The 8B6 T conversion (input data→transmission code) used for encoding of 8B6 T conversion scheme is realized by using an 8B6 T conversion table 130, as shown in FIG. 6.

First, 8B6 T conversion scheme defined in IEEE 802.3u will be described with reference to FIGS. 7A to 7D. A category called 100 BASE-T4 exists in Ethernet (registered trademark) standards, and is standardized as IEEE 802.3u. The code specified by IEEE 802.3u is called 8B6 T (hereinafter, an 8B6 T code). The 8B6 T code is obtained by converting 8-bit binary data into 6 ternary symbols based on conversion tables defined by IEEE 802.3u (see FIGS. 7A to 7D).

For example, when using these conversion tables, 8-bit binary data 10001110 (8Eh) is converted into 0, +1, 0, −1, 0, 0. In this case, the DC balance (=0+1+0−1+0+0) of 6 symbols is 0. Similarly, when using these conversion tables, binary data 01011100 (5Ch) is converted into +1, +1, 0, −1, −1, +1. In this case, the DC balance (=1+1+0−1−1+1) of 6 symbols is +1. In these conversion tables, there are 134 combinations with a DC balance 0, and all the DC balances of the remaining 122 combinations are +1.

Accordingly, if 8B6 T conversion table is used, combinations resulting in a DC balance +1 may occur consecutively depending on the pattern of binary data included in a data sequence to be encoded, and this results in significant imbalance of the DC balances of the 8B6 T code sequence to the positive side. Such imbalance in the DC balances will significantly deteriorate a waveform in a low-frequency cutoff transmission line. As a result, determination error will increase at the time of determining each amplitude level at the receiving side, and the transmission quality will be greatly deteriorated. Also, as shown in FIGS. 7A to 7D, the number of combinations of 8B data sequence and 6T symbol sequence included in the 8B6 T conversion table is extremely large. Accordingly, if such 8B6 T conversion table is held within a device, the circuit scale will be exceedingly large.

To solve the issue as described above, the inventor of the present invention has devised an encoding method that uses a conversion table with small size, that is capable of increasing transmission speed without speeding up a clock, and that is capable of generating a multilevel signal with a desirable DC balance. In the following, first and second embodiments according to this encoding method will be described one by one.

2: First Embodiment

In the following, a first embodiment of the present invention will be described. The technology of the present embodiment can be applied to data transmission through the serial signal line 28 of the mobile terminal 10 described above, for example.

As has been described, transmission speed can be increased by simply speeding up the clock. However, if the clock is sped up, the frequency spectrum of the transmission signal flowing through a serial transmission line becomes wide, resulting in the increase in the influence of EMI. Thus, the present embodiment proposes an encoding method that uses a conversion table with small size and that is capable of increasing transmission speed without widening the frequency spectrum of a transmission signal. Also, signal transmission in a transmission line having DC cutoff characteristics is assumed, and thus the technology of the present embodiment further aims to increase the transmission speed while preventing deterioration of transmission quality in such transmission line and avoiding widening of the frequency spectrum.

2-1: Encoding Method

First, an encoding method according to the present embodiment will be described. The encoding method according to the present embodiment is for distributing, into N branches (N≧2), a bit sequence that has been input and encoding the same. The encoding method according to the present embodiment includes a processing step of adjusting, for each branch, a symbol value included in a symbol sequence of each branch. After a transmission signal of each branch is generated based on the symbol sequence of each branch whose symbol value is adjusted by the processing step, transmission signals of N branches are added and transmitted through the serial signal line 28, for example. Additionally, since the symbol value is adjusted for each branch, even if transmission signals of N branches are added, the symbol sequence of each branch can be easily restored. By adding and transmitting transmission signals of N branches, the number of symbols transmitted during a 1-symbol period can be increased by N times. In the following, an explanation will be given while referring to a concrete example.

(Configuration of Transmitting Side)

Here, a configuration of a transmitting side capable of realizing the encoding method and a signal transmission method according to the present embodiment will be described with reference to FIG. 8 while taking a concrete example. FIG. 8 is an explanatory diagram showing an example of a configuration of a transmitting side capable of realizing the encoding method and a signal transmission method according to the present embodiment. For example, this configuration can be applied to the serializer 26 of the mobile terminal 10.

As shown in FIG. 8, the configuration of the transmitting side includes a distributor 202, 3B4B encoders 204 and 210, latch circuits 206, 212 and 222, P/S conversion units 208 and 214, an attenuator 216, and adders 218, 220, 224 and 226.

Additionally, in the following explanation, an encoding method based on 3B4B conversion for converting a 3-bit bit sequence into a binary symbol sequence of 4 symbols is taken as an example. However, the technical scope of the present embodiment is not limited to such. For example, 5B6B conversion for converting a 5-bit bit sequence into a binary symbol sequence of 6 symbols and the like can also be used.

Moreover, a configuration of distributing input data into two branches is illustrated here, but extension to a configuration of distribution to N branches (N≧3) is also possible. Note, however, that in the case of such extension, symbol value has to be adjusted at a different ratio for each branch. Here, a configuration of distribution into two branches will be illustrated.

First, input data is distributed by the distributor 202 into two branches. For example, the distributor 202 receives input data in units of 3 bits, and inputs the recieved 3-bit bit sequences alternately to the 3B4B encoders 204 and 210. When the 3-bit bit sequences distributed by the distributor 202 are input, the 3B4B encoders 204 and 210 generate binary symbol sequences of 4 symbols by 3B4B-converting the 3-bit bit sequences.

At this time, the 3B4B encoders 204 and 210 refer to a conversion table for 3B4B conversion shown in FIG. 9. For example, in a case a 3-bit bit sequence corresponding to a decimal number "3" is input, the 3B4B encoders 204 and 210 refer to the conversion table of FIG. 9, and output binary symbol sequences {−1, −1, +1, +1} of 4 symbols. Additionally, in a case a polarity-inverted signal described later is input, the 3B4B encoders 204 and 210 output the binary symbol sequences after inverting the polarities of the binary symbol sequences of 4 symbols according to the input value of the polarity-inverted signal.

The binary symbol sequences of 4 symbols output from the 3B4B encoders 204 and 210 in this manner are input respectively to the latch circuits 206 and 212, and are output at the same timing The binary symbol sequences output from the latch circuits 206 and 212 are input respectively to the P/S conversion units 208 and 214. The binary symbol sequences input to the P/S conversion units 208 and 214 are converted from parallel data into serial data. The binary symbol sequence which has been converted into serial data by the P/S conversion unit 208 (hereinafter, binary symbol sequence BS1) is input to the adder 218. Also, the binary symbol sequence which has been converted into serial data by the P/S conversion unit 214 is input to the attenuator 216.

Figure 10:
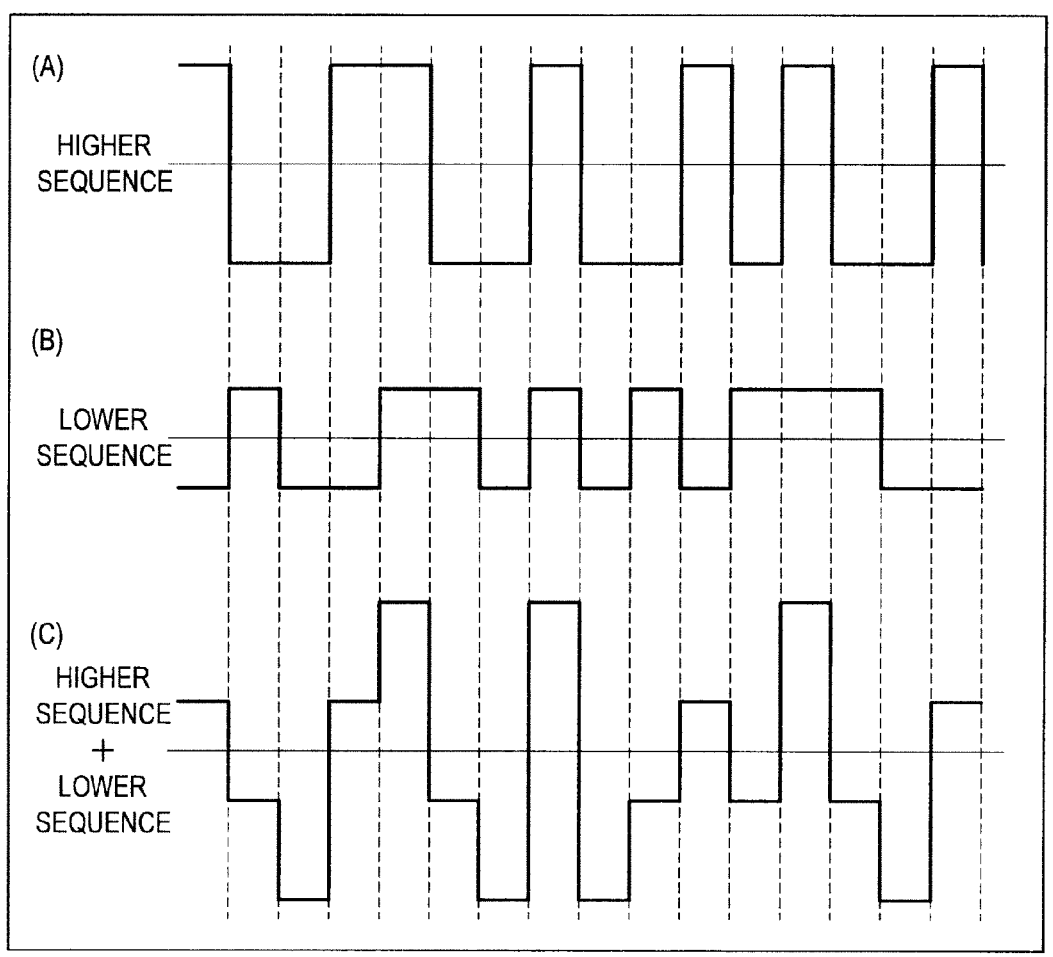
FIG. 10 is an explanatory diagram showing an example of an encoding method according to the embodiment.

The attenuator 216 attenuates each symbol value included in the input binary symbol sequence to 1/K (K=2 in the example of FIG. 8). The binary symbol sequence whose symbol values have been attenuated to 1/K by the attenuator 216 (hereinafter, binary symbol sequence BS2) is input to the adder 218. As described above, the binary symbol sequence BS1 and the binary symbol sequence BS2 whose symbol values are converted to 1/K are input to the adder 218. When these binary symbol sequences BS1 and BS2 are input, the adder 218 generates an added signal by synchronously adding the binary symbol sequences BS1 and BS2. For example, when the binary symbol sequence BS1 shown in (A) of FIG. 10 and the binary symbol sequence BS2 shown in (B) of FIG. 10 are input, the adder 218 generates an added signal with four levels shown in (C) of FIG. 10.

The added signal generated by the adder 218 is transmitted as an output signal to a receiving side. This added signal is also input to the adder 220. The adder 220 integrates added signals output from the adder 218. Also, the signal obtained by integration by the adder 220 is input to the latch circuit 222. The latch circuit 222 latches the input signal based on a word boundary, and inputs the latched signal as a polarity-inverted signal to the 3B4B encoder 204. The 3B4B encoder 204 outputs the binary symbol sequence as it is in a case the polarity-inverted signal has a positive value, and outputs the binary symbol sequence after inverting the polarity of the binary symbol sequence in a case the polarity-inverted signal has a negative value.

Furthermore, the polarity-inverted signal is input to the adder 226. Furthermore, an output signal of the adder 224 is input, together with the polarity-inverted signal, to the adder 226. The adder 226 adds the polarity-inverted signal and the output signal of the adder 224, and inputs the added value to the 3B4B encoder 210. An output signal of the 3B4B encoder 204 is input to the adder 224. Then, the adder 224 integrates output signals of the 3B4B encoder 204 for one word. This integrated value is input to the adder 226 and is added to a polarity-inverted signal (corresponding to the previous word), and thus by using the added value, polarity inversion control of the 3B4B encoder 210 can be performed that takes into consideration the output of the 3B4B encoder 204 for the current word.

Heretofore, a configuration of a transmitting side capable of realizing the encoding method and the signal transmission method according to the present embodiment has been described. By using the method described above, it becomes possible to transmit a 6-bit (3 bits+3 bits) bit sequence in a 4-symbol period, and transmission speed 6/4=1.5 times that for a case where a transmission signal based on the AMI code is transmitted as it is can be obtained. Also, polarity inversion control on a binary symbol sequence is performed based on a polarity-inverted signal, and thus the DC balance of an added signal to be transmitted to the receiving side can be kept in a good condition.

Furthermore, as can be seen from the example of FIG. 9, the size of the conversion table is significantly smaller than that of the conversion table of 8B6T conversion. With the size of the conversion table made small, the circuit scale is reduced, resulting in reduction in cost. Additionally, in the example of FIG. 8, two structural elements relating to 3B4B encoding are provided. However, by processing pieces of data of two branches in a time-division manner, the structural elements relating to the 3B4B encoding can be combined into one.

(Comparison between Spectra)

Figure 11A:
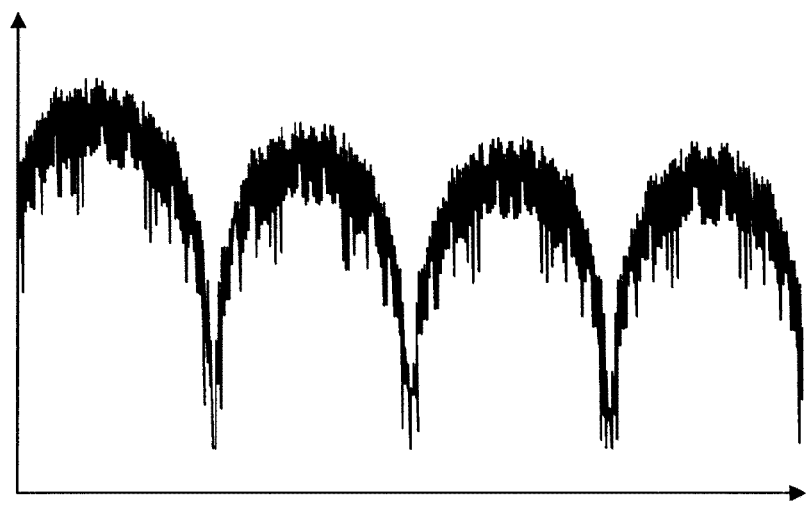
FIG. 11A is an explanatory diagram showing a frequency spectrum of a transmission signal based on an AMI code.
Figure 11B:
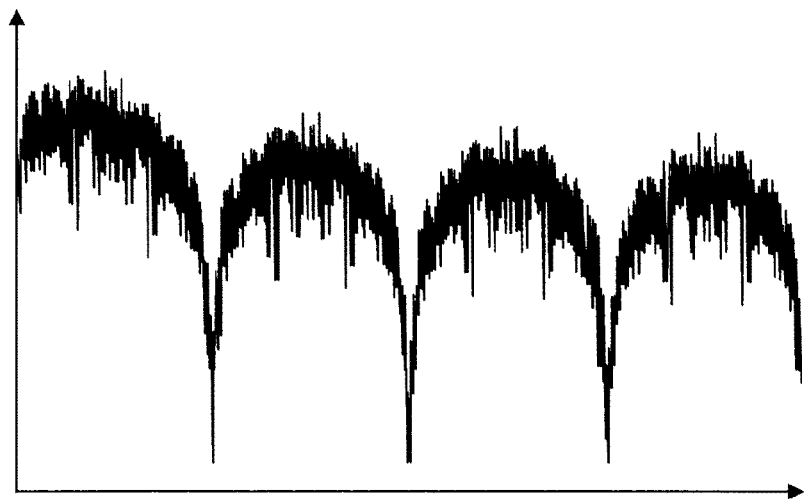
FIG. 11B is an explanatory diagram showing a frequency spectrum of a transmission signal based on a quaternary code generated by an encoding method according to the embodiment.

Here, a frequency spectrum of a quaternary signal (the added signal described above) obtained by the encoding method according to the present embodiment and a frequency spectrum of a transmission signal based on the AMI code will be compared with reference to FIGS. 11A and 11B. FIG. 11A shows a frequency spectrum of a transmission signal based on the AMI code. On the other hand, FIG. 11B shows a frequency spectrum of a quaternary signal obtained by the encoding method according to the present embodiment. The AMI code is a code that does not contain DC components. Accordingly, as shown in FIG. 11A, the DC components are sufficiently suppressed in the frequency spectrum. Furthermore, as described above, the DC balance is adjusted based on a polarity-inverted signal for the quaternary signal according to the present embodiment. Accordingly, as shown in FIG. 11B, the DC components are sufficiently suppressed in the frequency spectrum, as with the case of the AMI code.

Heretofore, the encoding method according to the present embodiment has been described.

2-2: Decoding Method

Next, a decoding method according to the present embodiment will be described. As described above, the added signal generated by the encoding method according to the present embodiment is a quaternary signal as shown in (C) of FIG. 10. Also, each of the possible amplitude values of the added signal corresponds to a combination of symbol values included in the binary symbol sequence BS1 and BS2.

Figure 13:
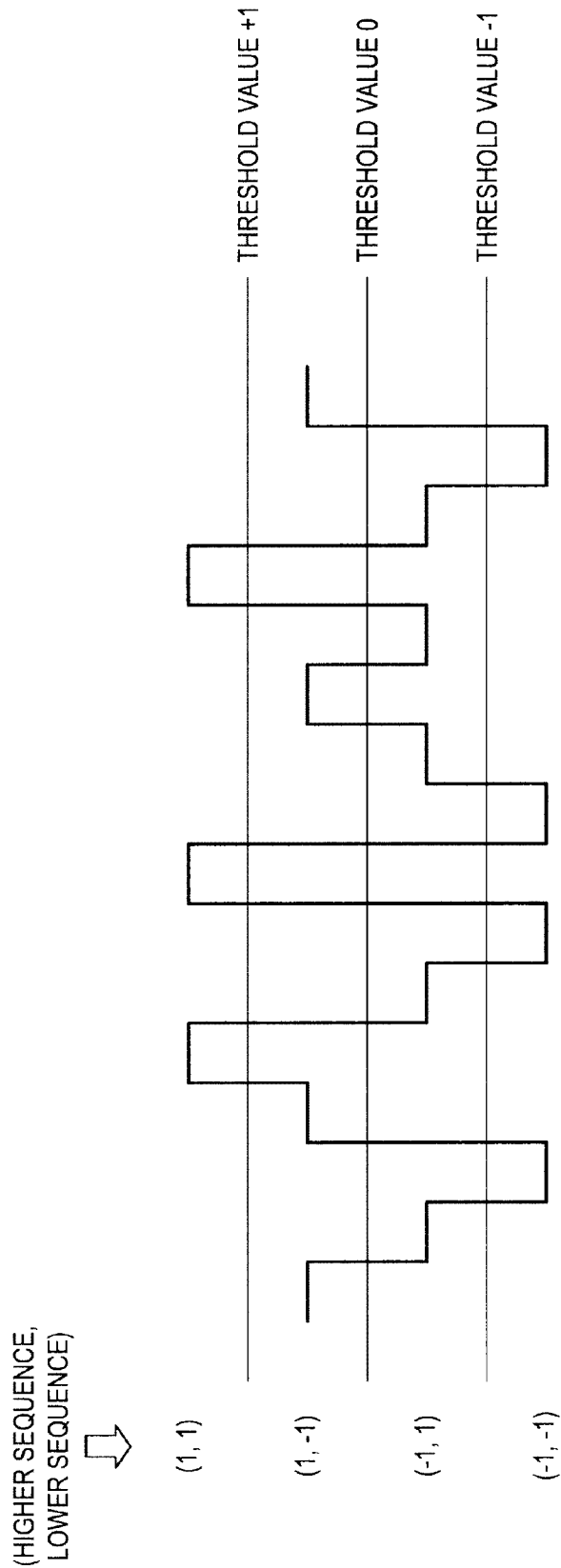
FIG. 13 is an explanatory diagram showing an example of a decoding method according to the embodiment.

In a case a symbol value included in the binary symbol sequence BS1 is −1 or +1, a symbol value included in the binary symbol sequence BS2 will be −0.5 or +0.5. Accordingly, the amplitude value of an added signal obtained by adding the binary symbol sequence BS and the binary symbol sequence BS2 will be any of −1.5, −0.5, +0.5 and +1.5. Amplitude value −1.5 of the added signal corresponds to a combination of (−1.0, −0.5). Similarly, amplitude values −0.5, +0.5 and +1.5 of the added signal respectively correspond to combinations of (−1.0, +0.5), (+1.0, −0.5), and (+1.0, +0.5). Accordingly, as shown in FIG. 13, by performing threshold determination by using three threshold values +1, 0 and −1, the binary symbol sequences BS1 (higher sequence) and BS2 (lower sequence) can be restored from the added signal.

(Configuration of Receiving Side)

Figure 12:
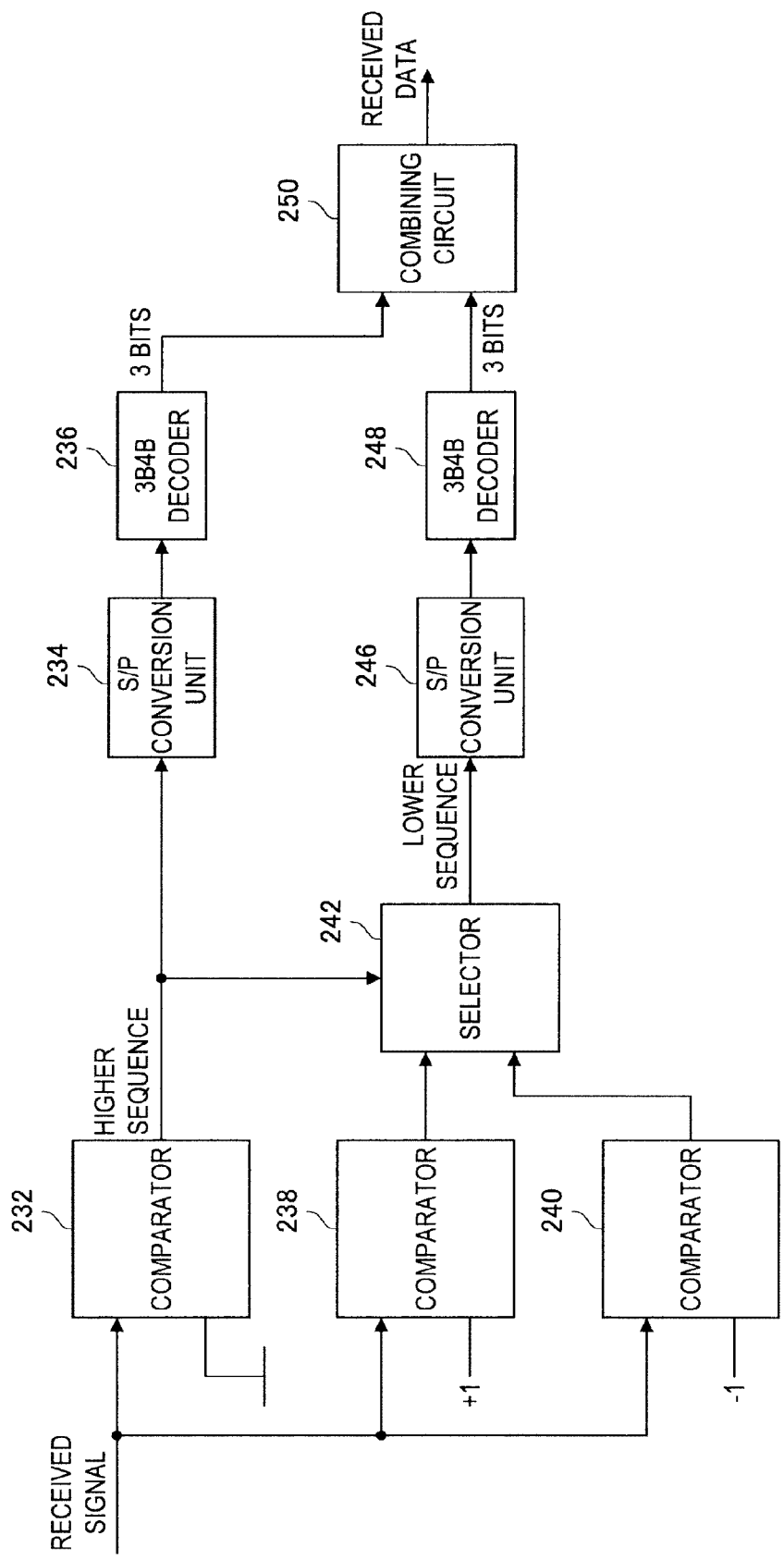
FIG. 12 is an explanatory diagram showing an example of a configuration of a receiving side capable of realizing a decoding method according to the embodiment.

Here, a configuration of a receiving side capable of realizing the decoding method according to the present embodiment will be described with reference to FIG. 12 while taking a concrete example. FIG. 12 is an explanatory diagram showing an example of a configuration of a receiving side capable of realizing the decoding method according to the present embodiment. For example, this configuration can be applied to the deserializer 30 of the mobile terminal 10.

As shown in FIG. 12, the configuration of the receiving side includes comparators 232, 238, 240, S/P conversion units 234 and 246, 3B4B decoders 236 and 248, a selector 242, and a combining circuit 250.

An added signal (received signal) transmitted from the transmitting side is input to the comparators 232, 238, 240. When the added signal is input, the comparator 232 compares the amplitude of the added signal with threshold value 0. In a case the amplitude value of the added signal is larger than threshold value 0, the comparator 232 outputs determination result 1. On the other hand, in a case the amplitude value of the added signal is smaller than threshold value 0, the comparator 232 outputs determination result −1. As shown in FIG. 13, in a case the amplitude value of the added signal is larger than threshold value 0, the symbol value of the binary symbol sequence BS1 (higher sequence) will be 1. In contrast, in a case the amplitude value of the added signal is smaller than threshold value 1, the symbol value of the binary symbol sequence BS1 (higher sequence) will be 0. That is, the determination result by the comparator 232 will directly be a restored value of the binary symbol sequence BS1.

The determination result by the comparator 232 is input to the S/P conversion unit 234 and the selector 242. When the determination result (restored value) is input, the S/P conversion unit 234 converts serial data into parallel data in units of 4 symbols. Then, the S/P conversion unit 234 inputs, to the 3B4B decoder 236, the restored value that has been converted into the parallel data. When the restored value is input, the 3B4B decoder 236 refers to the conversion table shown in FIG. 9, and converts the restored value of 4 bits into a 3-bit bit sequence. Then, the 3B4B decoder 236 inputs the 3-bit bit sequence to the combining circuit 250.

On the other hand, the comparator 238 compares the amplitude value of the added signal with threshold value +1. Then, the result of comparison by the comparator 238 is input to the selector 242. Similarly, the comparator 240 compares the amplitude value of the added signal with threshold value −1. Then, the result of comparison by the comparator 240 is input to the selector 242. As described above, the results of comparison by the comparators 232, 238, 240 are input to the selector 242. The selector 242 restores, from these results of comparison, the symbol values of the binary symbol sequence BS2. Note that the selector 242 restores a binary symbol sequence (hereinafter, binary symbol sequence BS2′) for which the symbol values which were attenuated to 1/K are restored to their original states. The selector 242 outputs restored value 1 in a case the amplitude value of the added signal is +1.5 or −0.5, and outputs restored value −1 in a case the amplitude value of the added signal is +0.5 or −1.5.

The restored value output by the selector 242 is input to the S/P conversion unit 246. When the restored value is input, the S/P conversion unit 246 converts the serial data into parallel data in units of 4 symbols. Then, the S/P conversion unit 246 inputs, to the 3B4B decoder 248, the restored value that has been converted into the parallel data. When the restored value is input, the 3B4B decoder 248 refers to the conversion table shown in FIG. 9, and converts the restored value of 4 bits into a 3-bit bit sequence. Then, the 3B4B decoder 248 inputs the 3-bit bit sequence to the combining circuit 250. Then, the combining circuit 250 alternately outputs the bit sequence that has been input from the 3B4B decoder 236 and the bit sequence that has been input from the 3B4B decoder 248. As a result, the input data is restored.

Heretofore, a configuration of a receiving side that is capable of realizing the decoding method according to the present embodiment has been described. By using the above-described method, input data can be restored from an added signal.

Heretofore, the first embodiment of the present invention has been described. By adopting the configuration of the present embodiment, transmission speed 1.5 times that of a case where a transmission signal based on the AMI code is transmitted as it is can be obtained. Also, with polarity inversion control being performed on a binary symbol sequence, the DC balance of an added signal transmitted to the receiving side can be kept in a good condition. As a result, desirable transmission quality can be maintained in a DC cutoff transmission line.

3: Second Embodiment

Next, a second embodiment of the present invention will be described. The technology of the present embodiment can be applied to data transmission through the serial signal line 28 of the mobile terminal 10 described above, for example. As with the first embodiment described above, the present embodiment proposes an encoding method that uses a conversion table with small size and that is capable of increasing transmission speed without widening the frequency spectrum of a transmission signal. Also, signal transmission in a transmission line having DC cutoff characteristics is assumed, and thus the technology of the present embodiment further aims to increase the transmission speed while preventing deterioration of transmission quality in such transmission line and avoiding widening of the frequency spectrum.

3-1: Encoding Method

First, an encoding method according to the present embodiment will be described. The encoding method according to the present embodiment is for distributing, into N branches (N≧2), a bit sequence that is input and encoding the same. The encoding method according to the present embodiment includes a step of adjusting timings for symbol sequences of respective branches to be different by a 1/N-symbol period. Transmission signals based on symbol sequences of N branches on which timing adjustment has been performed by this step are added and transmitted through the serial signal line 28, for example. Additionally, since the timings are different by a 1/N-symbol period for the respective branches, the symbol sequence of each branch can be easily restored even if transmission signals of N branches are added. As described, by adding and transmitting transmission signals of N branches, the number of symbols transmitted during a 1-symbol period can be increased by N times. In the following, an explanation will be given while referring to a concrete example.

(Configuration of Transmitting Side)

Figure 14:
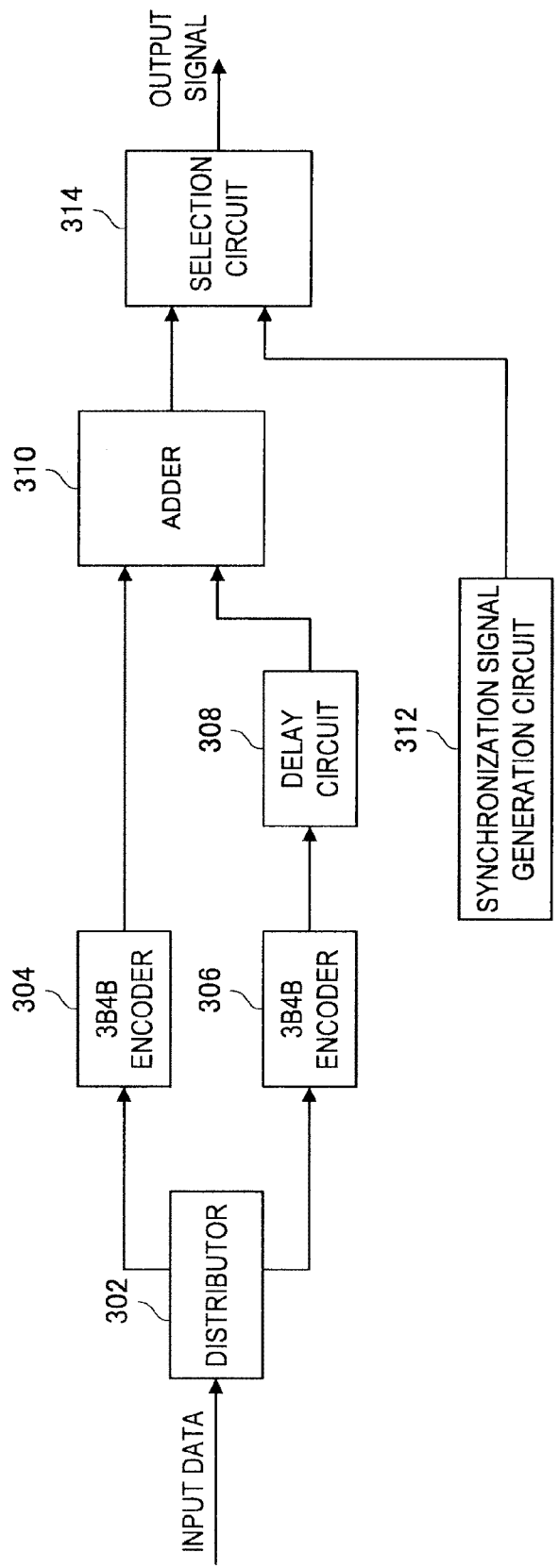
FIG. 14 is an explanatory diagram showing an example of a configuration of a transmitting side capable of realizing an encoding method according to a second embodiment of the present invention.

Here, a configuration of a transmitting side capable of realizing the encoding method and a signal transmission method according to the present embodiment will be described with reference to FIG. 14 while taking a concrete example. FIG. 14 is an explanatory diagram showing an example of a configuration of a transmitting side capable of realizing the encoding method and a signal transmission method according to the present embodiment. For example, this configuration can be applied to the serializer 26 of the mobile terminal 10.

As shown in FIG. 14, the configuration of the transmitting side includes a distributor 302, 3B4B encoders 304 and 306, a delay circuit 308, an adder 310, a synchronization signal generation circuit 312, and a selection circuit 314.

Additionally, in the following explanation, an encoding method based on 3B4B conversion for converting a 3-bit bit sequence into a binary symbol sequence of 4 symbols is taken as an example. However, the technical scope of the present embodiment is not limited to such. For example, 5B6B conversion for converting a 5-bit bit sequence into a binary symbol sequence of 6 symbols and the like can also be used.

Moreover, a configuration of distributing input data into two branches is illustrated here, but extension to a configuration of distribution to N branches (N≧3) is also possible. Note, however, that in the case of such extension, timings have to be adjusted so as to be different by a 1/N-symbol period between the branches. Here, a configuration of distribution into two branches is illustrated.

First, input data is distributed by the distributor 302 into two branches. For example, the distributor 302 receives input data in units of 3 bits, and inputs the received 3-bit bit sequences alternately to the 3B4B encoders 304 and 306. When the 3-bit bit sequences distributed by the distributor 302 are input, the 3B4B encoders 204 and 206 generate binary symbol sequences of 4 symbols by 3B4B-converting the 3-bit bit sequences. At this time, the 3B4B encoders 304 and 306 refer to the conversion table for 3B4B conversion shown in FIG. 9. For example, in a case a 3-bit bit sequence corresponding to a decimal number "3" is input, the 3B4B encoders 304 and 306 refer to the conversion table of FIG. 9, and output binary symbol sequences {−1, −1, +1, +1} of 4 symbols.

A binary symbol sequence BS1 output from the 3B4B encoder 304 is input to the adder 310. Also, a binary symbol sequence BS2 output from the 3B4B encoder 304 is input to the delay circuit 308. When the binary symbol sequence BS2 is input, the delay circuit 308 delays the binary symbol sequence BS2 by a ½-symbol period. Then, the delay circuit 308 inputs, to the adder 308, the binary symbol sequence BS2 which is delayed by ½-symbol sequence. When the binary symbol sequences BS1 and BS2 are input, the adder 310 adds these binary symbol sequences BS1 and BS2, and generates an added signal. Then, the adder 310 inputs the generated added signal to the selection circuit 314.

Figure 15:
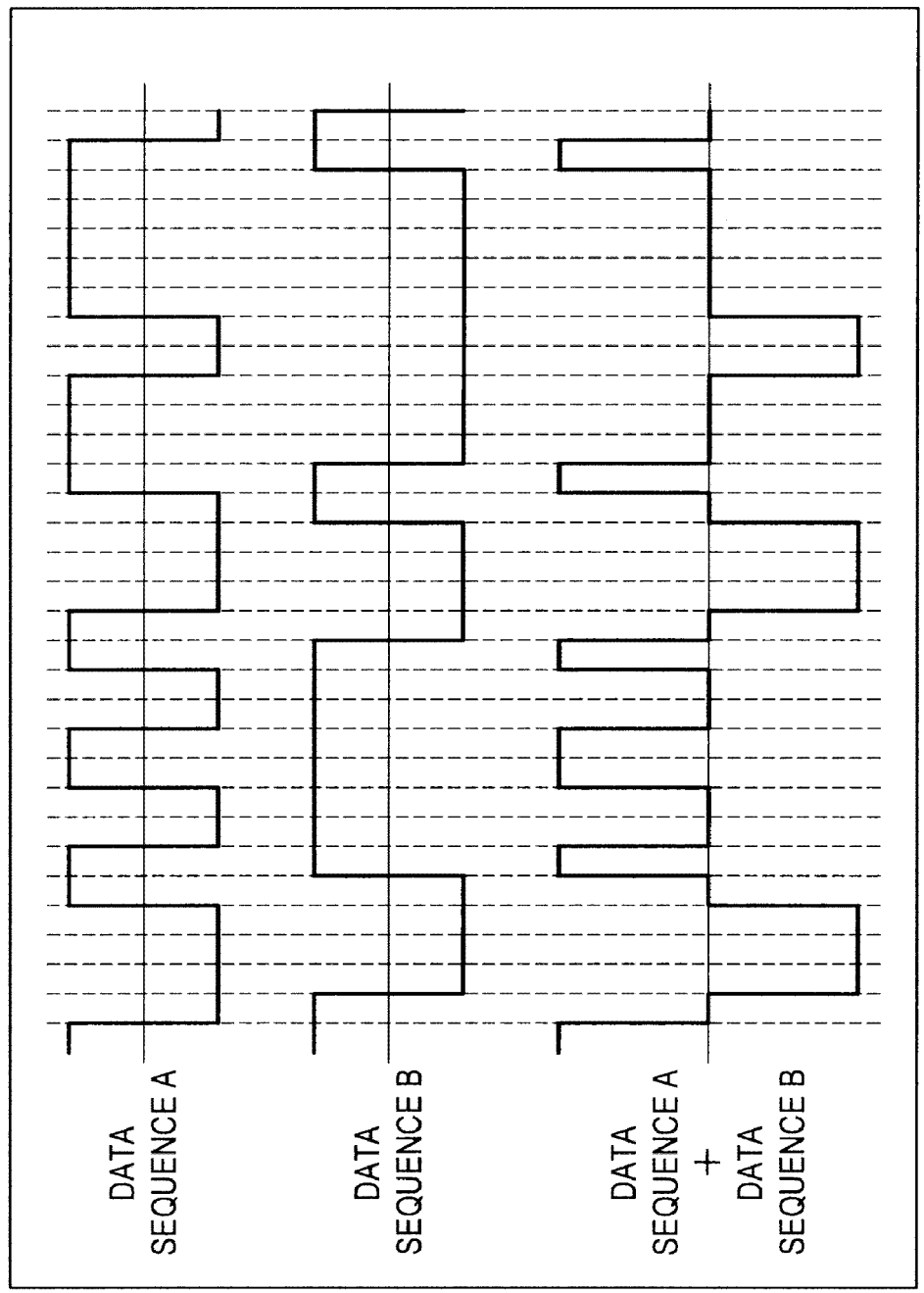
FIG. 15 is an explanatory diagram showing an example of an encoding method according to the embodiment.

Here, characteristics of the added signal output from the adder 310 will be supplementarily described with reference to FIG. 15. FIG. 15 illustrates a signal waveform of data sequence A corresponding to the binary symbol sequence BS1 output from the 3B4B encoder 304 and a signal waveform of a data sequence B corresponding to the binary symbol sequence BS2 output from the delay circuit 308. Furthermore, FIG. 15 illustrates a signal waveform of an added signal (data sequence A+data sequence B) obtained by adding the signal waveform of the data sequence A and the signal waveform of the data sequence B. Additionally, the width between two broken lines shown in FIG. 15 indicates ½-symbol period.

Figure 16A:
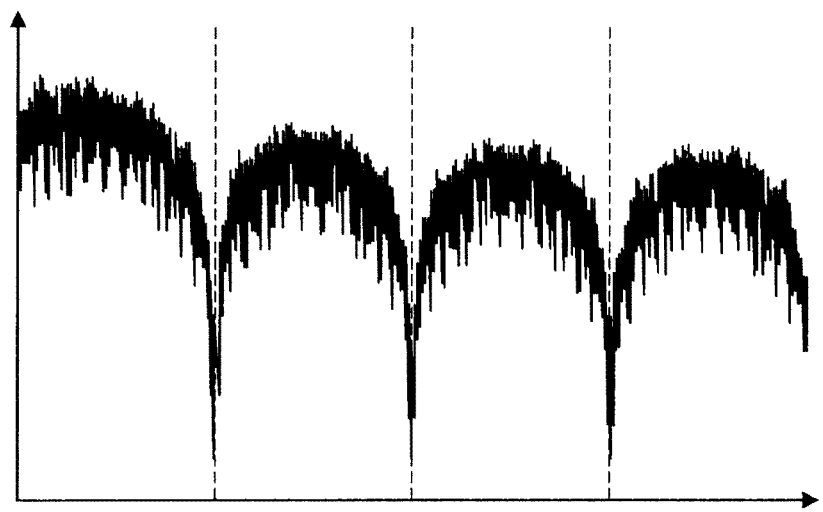
FIG. 16A is an explanatory diagram showing a frequency spectrum of a transmission signal based on a binary code.
Figure 16B:
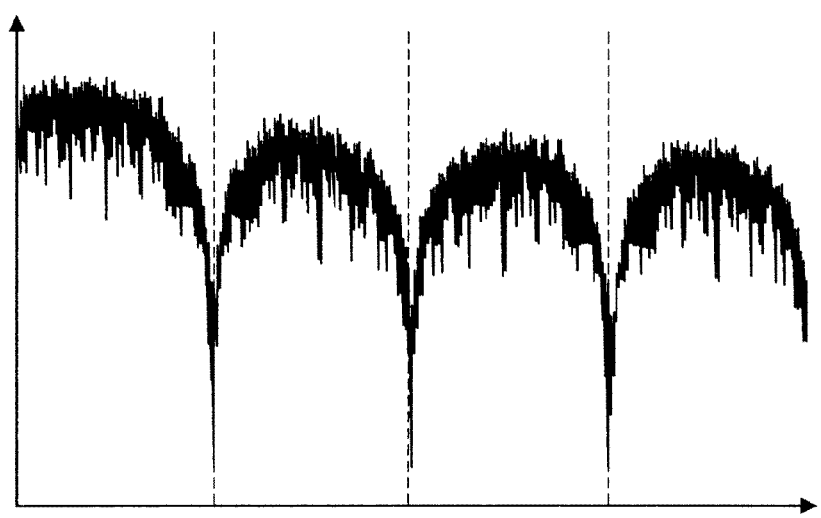
FIG. 16B is an explanatory diagram showing a frequency spectrum of a transmission signal based on a ternary code generated by an encoding method of the embodiment.

As can be seen from the example of FIG. 15, the added signal output from the adder 310 is a ternary signal. For example, if the symbol values of the binary symbol sequences BS1 and BS2 are +1 and −1, an amplitude value of the added signal will be any of +2, 0 and −2. Furthermore, a frequency spectrum of the added signal will be as shown in FIG. 16B. Compared to the frequency spectrum of a binary code (3B4B code) shown in FIG. 16A, it can be seen that the frequency band is not wider in the frequency spectrum of the added signal and that the DC components are sufficiently suppressed.

Reference will be again made to FIG. 14. The synchronization signal generation circuit 312 generates a synchronization signal at the time of transmitting data. Then, the synchronization signal generation circuit 312 inputs the generated synchronization signal to the selection circuit 314. The selection circuit 314 outputs the synchronization signal input from the synchronization signal generation circuit 312, and then outputs the added signal input from the adder 310. The signals output from the selection circuit 314 are transmitted to the receiving line through the serial transmission line 28, for example.

Heretofore, a configuration of a transmitting side capable of realizing the encoding method and the signal transmission method according to the present embodiment has been described. By using the above-described method, it becomes possible to transmit a 6-bit (3 bits+3 bits) bit sequence in a 4-symbol period, and transmission speed 6/4=1.5 times that of a case where a transmission signal based on the AMI code is transmitted as it is can be obtained. Also, as shown in FIG. 16B, the DC balance of an added signal can be kept in a good condition.

3-2: Decoding Method

Next, a decoding method according to the present embodiment will be described. As described above, the added signal generated by the encoding method according to the present embodiment is a ternary signal as shown in FIG. 15 (data sequence A+data sequence B). Symbol values of the binary symbol sequences BS1 and BS2 can be calculated from the amplitude value of the added signal detected every ½-symbol period.

For example, symbol values of the binary symbol sequence BS1 are respectively expressed as A11, A12, . . . , A1L, and symbol values of the binary symbol sequence BS2 are respectively expressed as A21, A22, . . . , A2L. Also, the amplitude values of the added signal are expressed as X(1), X(2), . . . , X(2*L) with the ½-symbol period as the unit. As described, the binary symbol sequence BS2 is delayed by ½-symbol period. Therefore, X(1) will be A11+α, X(2) will be A11+A21, and X(3) will be A21+A12, . . . . The "α" is an initial value.

First, (step S1) symbol value A11 of the binary symbol sequence BS1 is determined from amplitude value X(1) of the added signal. Next, (step S2) symbol value A21 of the binary symbol sequence BS2 is determined from amplitude value X(2) of the added signal and symbol value A11 of the binary symbol sequence BS1 determined in step S1. Then, (step S3) symbol value A12 of the binary symbol sequence BS1 is determined from amplitude value X(3) of the added signal and symbol value A21 of the binary symbol sequence BS2 determined in step S2. By sequentially repeating these processes, the symbol values of the binary symbol sequences BS1 and BS2 can be alternately calculated from the amplitude values of the added signal.

However, this method is somewhat complicated. Accordingly, the inventor of the present invention took notice that the binary symbol sequence is used in the present embodiment, and devised a method of sequentially restoring binary symbol sequences based on amplitude change of the added signal. According to this method, an initial value has to be set to the first symbol values A11, A21 included in the binary symbol sequences BS1 and BS2. However, if the initial value is set, the second symbol values A12, A22 will be determined by deciding whether the amplitude value of the added signal has changed or not. Similarly, the third and subsequent symbol values will be determined.

For example, when initial value A11=A21=1 and X(1)=A11+A21, X(2)=A12+A21, X(3)=A12+A22, X(4)=A13+A22, . . . , A12 is determined to be −1 in a case X(1) changed to X(2). A22 is determined to be −1 in a case X(2) changed to X(3). The binary symbol sequences BS1 and BS2 can be restored by sequentially detecting the amplitude change of the added signal in this manner (see FIG. 18).

(Configuration of Receiving Side)

Figure 17:
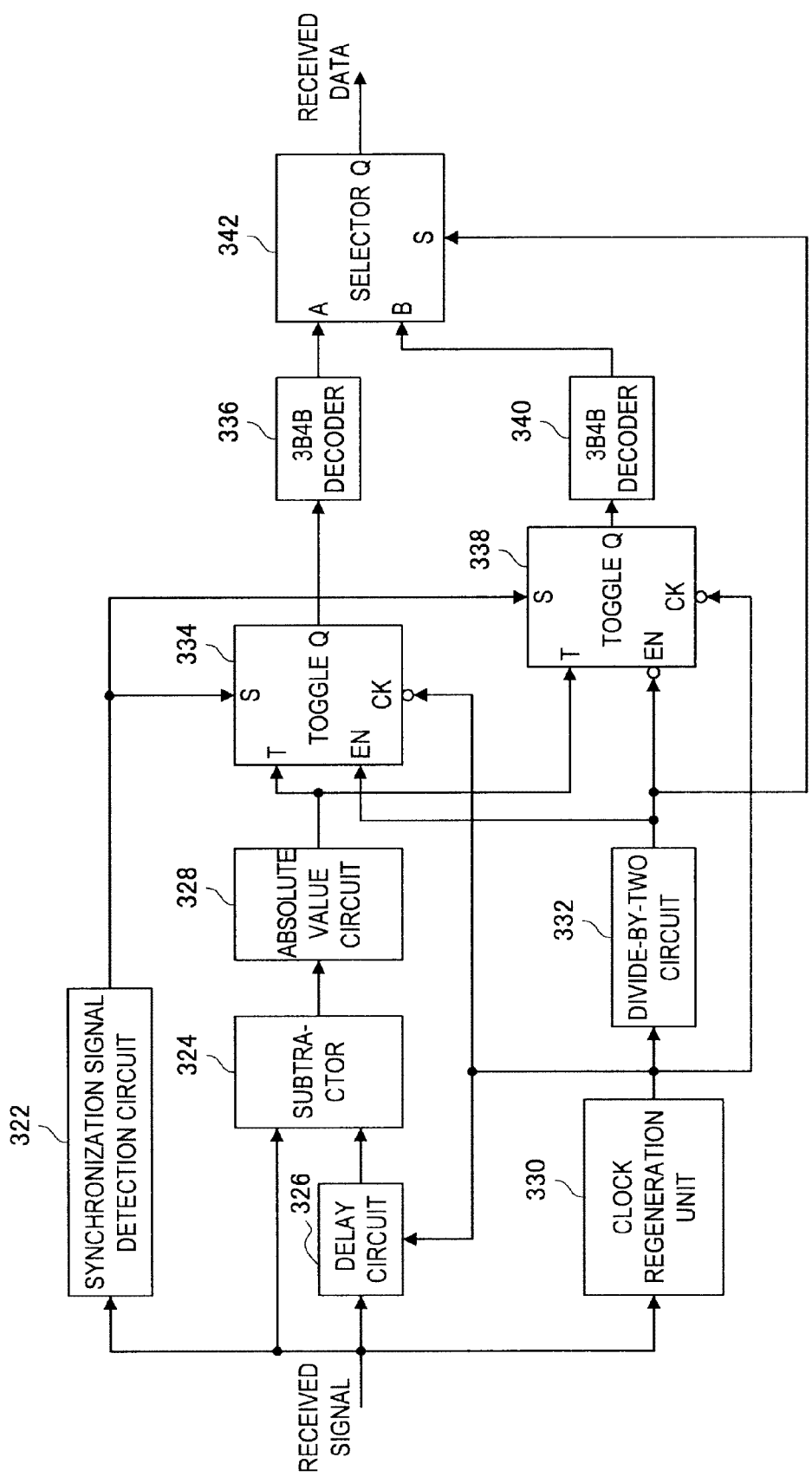
FIG. 17 is an explanatory diagram showing an example of a configuration of a receiving side capable of realizing a decoding method according to the embodiment.

Here, a configuration of a receiving side capable of realizing the decoding method according to the present embodiment will be described with reference to FIG. 17 while taking a concrete example. FIG. 17 is an explanatory diagram showing an example of a configuration of a receiving side capable of realizing the decoding method according to the present embodiment. For example, this configuration can be applied to the deserializer 30 of the mobile terminal 10.

As shown in FIG. 17, the configuration of the receiving side includes a synchronization signal detection circuit 322, a subtractor 324, a delay circuit 326, an absolute value circuit 328, a clock regeneration unit 330, a divide-by-two circuit 332, toggle circuits 334 and 338, 3B4B decoders 336 and 340, and a selector 342.

A synchronization signal and an added signal (received signal) transmitted from the transmitting side are input to the synchronization signal detection circuit 322, the subtractor 324, the delay circuit 326 and the clock regeneration unit 330. First, when the received signal is input, the synchronization signal detection circuit 322 detects the synchronization signal in the received signal. Then, when the synchronization signal is detected, the synchronization signal detection circuit 322 sets the toggle circuits 334 and 338. Also, when the received signal is input, the clock regeneration unit 330 regenerates a symbol cock from the received signal. One cycle of the symbol clock regenerated here corresponds to a 1-symbol period of the binary symbol sequences BS1 and BS2.

The clock regeneration unit 330 inputs the regenerated symbol clock to the delay circuit 326, the divide-by-two circuit 332, and the toggle circuits 334 and 338. Note that a symbol clock that has been inverted is input to the toggle circuits 334 and 338. When the received clock and the symbol clock are input, the delay circuit 326 delays the received signal by a half cycle of the symbol clock. Then, the delay circuit 326 inputs the delayed received signal to the subtractor 324. When the undelayed received signal and the received signal which is delayed by the delay circuit 326 are input, the subtractor 324 subtracts the delayed received signal from the undelayed received signal. Then, the subtractor 324 inputs the subtraction result (hereinafter, subtracted value) to the absolute value circuit 328.

The absolute value circuit 328 calculates an absolute value of the subtracted value input from the subtractor 324, and inputs the same to the toggle circuits 334 and 338. Also, the divide-by-two circuit 332 generates a signal which is inverted with every symbol based on the symbol clock regenerated by the clock regeneration unit 330, and inputs the same to enable terminals (EN) of the toggle circuits 334 and 338. The signal input to the toggle circuit 338 here is input after being inverted. The toggle circuits 334 and 338 perform an operation in a case EN is 1, and perform an inverting operation in a case T is 1. Thus, the toggle circuits 334 and 338 alternately operate according to the output of the divide-by-two circuit 332. Also, the toggle circuits 334 and 338 perform an inverting operation in a case an output of the absolute value circuit 328 is 1, and perform a non-inverting operation in a case of 0. Then, outputs of the toggle circuits 334 and 338 are input respectively to the 3B4B decoders 336 and 340.

The 3B4B decoders 336 and 340 refer to the conversion table shown in FIG. 9, and respectively convert the binary symbol sequence BS1 or BS2 of 4 symbols into a 3-bit bit sequence. Then, the 3B4B decoders 336 and 340 respectively input the 3-bit bit sequence to the selector 342. When the bit sequences are input, the selector 342 alternately outputs the bit sequence input from the 3B4B decoder 336 and the bit sequence input from the 3B4B decoder 340. As a result, the input data (received data) is restored.

Figure 18:
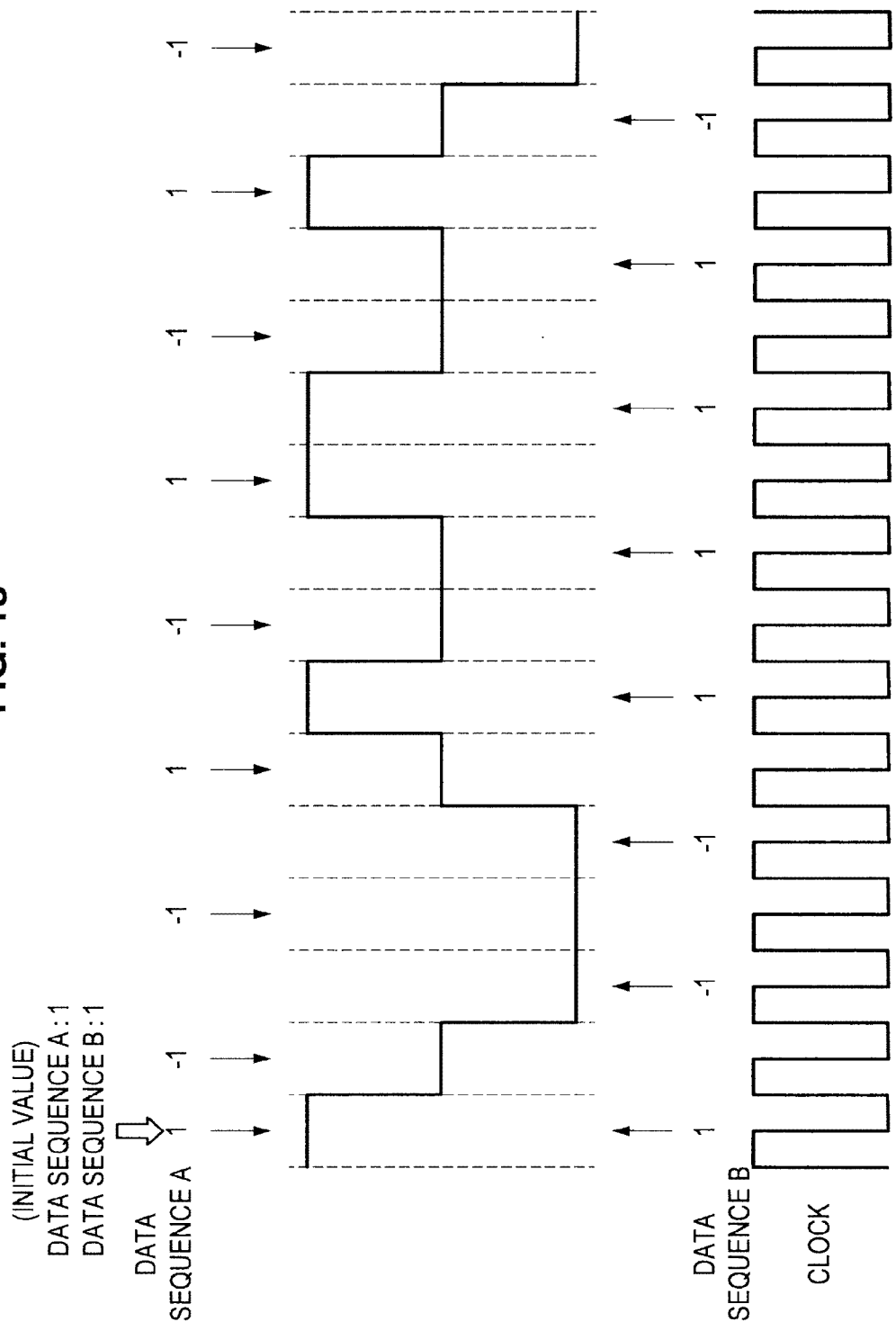
FIG. 18 is an explanatory diagram showing an example of a decoding method according to the embodiment.

Here, the decoding method according to the present embodiment will be supplementarily described with reference to FIG. 18. FIG. 18 shows a signal waveform of an added signal, binary symbol sequences BS1 and BS2 (data sequences A and B) restored from the added signal, and a waveform of a symbol clock regenerated based on the added signal. Additionally, in the example of FIG. 18, initial values of the data sequences A and B are set to 1.

However, the initial values do not have to be set to 1, and may be set to −1, for example. That is, it is enough that the same initial value is set for the data sequences A and B. If the combination of the initial values is (+1, −1), the amplitude value of the added signal will be 0. In this case, whether the initial values are (+1, −1) or (−1, +1) is not fixed.

As described above, when the synchronization signal is detected, the toggle circuits 334 and 338 are set. At this time, the initial values of the toggle circuits 334 and 338 are set to 1. By checking, after setting the initial values to 1, the change in the received signal every 1 symbol, values of the data sequences A and B can be alternately obtained. For example, in the example of FIG. 18, the received signal changes from 1 to 0 at the first timing. Therefore, it can be understood that the data sequence A has changed from 1 to −1. Next, referring to the second timing, the received signal changes from 0 to −1 at this timing. Therefore, it can be understood that the data sequence B has changed from 1 to −1. The data sequences A and B are restored by sequentially repeating such processing steps.

Heretofore, the decoding method according to the present embodiment and a configuration of a receiving side capable of realizing the decoding method have been described.

3-3: Modified Example

Figure 19:
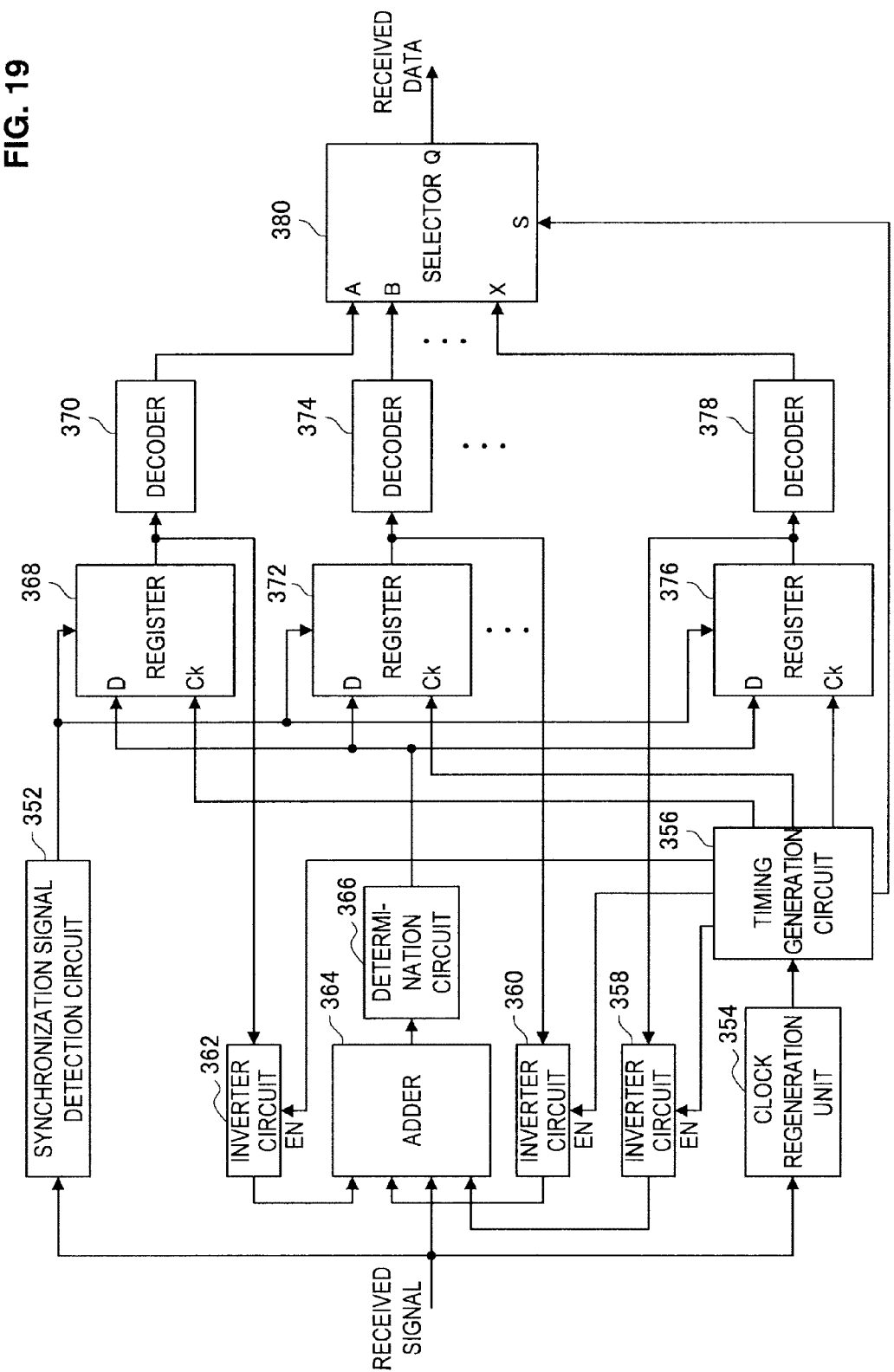
FIG. 19 is an explanatory diagram showing an example of a configuration of a receiving side capable of realizing a decoding method according to the embodiment.

Next, a configuration of a receiving side according to a modified example of the present embodiment will be described with reference to FIG. 19. FIG. 19 is an explanatory diagram showing an example of a configuration of a receiving side according to a modified example of the present embodiment. This modified example relates to a configuration of extension to a case of distributing input data to three or more branches. Additionally, in the case of distributing input data to three or more branches, it is enough that a functional block equivalent to the processing block configured from the 3B4B encoder 306 and the delay circuit 308 among the elements shown in FIG. 14 is added to the configuration of a transmitting side by the number of the added branches. Note that the delay time set for the j-th branch will be (j−1)/N-symbol period (j=1 to N; N is the number of branches).

On the other hand, the configuration of a receiving side will be as shown in FIG. 19. As shown in FIG. 19, the configuration of the receiving side includes a synchronization signal detection circuit 352, a clock regeneration unit 354, a timing generation circuit 356, inverter circuits 358, 360 and 362, an adder 364, a determination circuit 366, registers 368, 372 and 376, decoders 370, 374 and 378, and a selector 380.

A received signal is input to the synchronization signal detection circuit 352, the adder 364, and the clock regeneration unit 354. The clock regeneration unit 354 regenerates a symbol clock that is synchronized with the received signal. Then, the clock regeneration unit 354 inputs the regenerated symbol clock to the timing generation circuit 356. When the symbol clock is input, the timing generation circuit 356 generates a timing signal used for the operation of each circuit based on the symbol clock. Then, the timing generation circuit 356 inputs the generated timing signal to the inverter circuits 358, 360 and 362, and the registers 368, 372 and 376.

Furthermore, the synchronization signal detection circuit 352 detects a synchronization signal in the received signal. When the synchronization signal is detected, the synchronization signal detection circuit 352 inputs the detected synchronization signal to the registers 368, 372 and 376. When the synchronization signal is input, the registers 368, 372 and 376 are initialized. Furthermore, in a case the timing signal input from the timing generation circuit 356 is enable, the inverter circuits 358, 360 and 362 output the outputs of the registers 368, 372 and 376 after inverting the same. On the other hand, in a case the timing signal is disable, zero is output.

Furthermore, the adder 364 adds the received signal and the output signals of the inverter circuits 358, 360 and 362, and inputs the same to the determination circuit 366. The determination circuit 366 determines the sign (+/−) of the input signal, and inputs the determination result to the registers 368, 372 and 376. Then, a register, among the registers 368, 372 and 376, specified by the timing generation circuit 356 by using the timing signal receives the determination result input from the determination circuit 366. For example, the register 368 receives the determination result input from the determination circuit 366.

In the case the register 368 received the determination result input from the determination circuit 366, the output of the register 368 is input to the decoder 370 and the inverter circuit 362. Also, in the case the register 372 received the determination result input from the determination circuit 366, the output of the register 372 is input to the decoder 374 and the inverter circuit 360. Furthermore, in the case the register 376 received the determination result input from the determination circuit 366, the output of the register 376 is input to the decoder 378 and the inverter circuit 358.

The decoders 370, 374 and 378 perform a decoding process respectively at a timing specified by the timing generation circuit 356 by using the timing signal. Then, the decoders 370, 374 and 378 input decoding results to the selector 380. The selector 380 outputs the decoding results input from the decoder 370, 374, 378 at timings (order) specified by the timing generation circuit 356 by using the timing signal. As a result, original input data is restored from the received signal.

In the case of the above-described configuration, a plurality of encoded binary symbol sequences are added in a temporally-shifted manner. With respect to a binary symbol sequence of a particular branch, when the binary symbol sequence of another branch is known and the binary symbol sequence of the other branch can be subtracted from a signal obtained by adding the binary symbol sequences of the two branches, the binary symbol sequence of the particular branch is extracted. Accordingly, by subtracting, after initializing registers storing data of respective branches by a synchronization signal, register values other than that of the code to be determined from a received signal, it becomes possible to determine only the binary symbol sequence of the particular branch by the determination circuit. That is, it is enough simply to perform binary determination of + and −. Pieces of output data of the inverter circuits 358, 360 and 362 input to the adder 364 are made 0 for the particular branch for which determination is to be performed. Thus, pieces of data of other branches are removed based on up-to-now determination results. Then, the determination result is stored only in a particular register.

Heretofore, a modified example of the present embodiment has been described. In this manner, the encoding method and the decoding method can be extended to a method of distributing input data to three or more branches and transmitting the same.

Heretofore, the second embodiment of the present invention has been described. By using the configuration of the present embodiment, transmission speed 1.5 times that of a case where a transmission signal based on the AMI code is transmitted as it is can be obtained. Also, the DC balance of an added signal can be kept in a good condition, and desirable transmission quality can be maintained in a DC cutoff transmission line

4: Summary

Lastly, technical ideas of the first and second embodiments described above will be summarized.

4-1: Summary of Points

First, points of the technologies according to the first and second embodiments described above will be summarized.

Point of First Embodiment

As shown in FIG. 21, the first embodiment described above relates to a signal transmission method of separating input data into code sequences (code 1, code 2) of two branches, and adjusting one of the them (code 2) to have an amplitude half that of the other (code 1) and adding code 2 to code 1 before transmitting the same. As shown in FIG. 21, code 1+code 2 will be a quaternary code. However, since it becomes possible to transmit twice amount of code in 1-symbol period, transmission speed can be increased without speeding up a symbol clock. For example, when a 3B4B code is used, transmission speed 1.5 times that of a case where the AMI code is used can be obtained.

Point of Second Embodiment

As shown in FIG. 20, the second embodiment described above relates to a signal transmission method of separating input data into code sequences (code 1, code 2) of two branches, and shifting one of them (code 2) by a ½-symbol period and adding code 2 to the other (code 1) before transmitting the same. As shown in FIG. 20, code 1+code 2 will be a ternary code. However, since it becomes possible to transmit twice amount of code in 1-symbol period, transmission speed can be increased without speeding up a symbol clock. For example, when a 3B4B code is used, transmission speed 1.5 times that of a case where the AMI code is used can be obtained.

4-2: Summary of Expression

Next, the technical contents according to the embodiment of the present invention will be briefly described. The technical contents stated here can be applied to various information processing apparatuses, such as a personal computer, a mobile phone, a portable game machine, a portable information terminal, an information appliance, a car navigation system, and the like.

Corresponding to Second Embodiment

The functional configuration of the information processing apparatus described above can be expressed as follows. The information processing apparatus includes a distributor, an encoding unit, a signal generation unit, a signal delay unit, a signal addition unit and a signal transmitting unit as described below. The distributor distributes input data in units of M bits and generates N M-bit bit sequences. Also, the encoding unit converts each of the N bit sequences distributed by the distributor into a binary symbol sequence of K symbols and generates N binary symbol sequences. At this time, the encoding unit converts the M-bit bit sequence into the binary symbol sequence of K symbols such that the binary symbol sequence of K symbols does not contain a DC component, by using an encoding method capable of realizing a desirable DC balance. For example, various encoding methods, such as 3B4B conversion described above and 8B10B conversion, can be applied.

As described above, N binary symbol sequences are generated by the encoding unit. This N binary symbol sequences are input to the signal generation unit described above. Then, the signal generation unit generates N transmission signals Sj (j=1 to N) synchronized with a specific symbol clock and having, as an amplitude value, each symbol value included in the N binary symbol sequences. That is, signal waveforms corresponding to N binary symbol sequences are obtained by the signal generation unit. Then, the signal delay unit delays, with regard to j (j=1 to N), the signals Sj generated by the signal generation unit by a (j−1)/N-symbol period and generates delay signals Rj.

The delay signals Rj generated by the signal delay unit are input to the signal addition unit. Then, the signal addition unit adds the delay signals Rj (j=1 to N) generated by the signal delay unit and generates an added signal. Furthermore, the signal transmitting unit transmits the added signal generated by the signal addition unit. As described above, the information processing apparatus according to the present embodiment has a configuration of separating input data into N binary symbol sequences, sequentially temporally shifting timings of the binary symbol sequences by 1/N-symbol period, adding the N binary symbol sequences whose timings are shifted from each other, and transmitting the same.

Here, a case where N is 2 will be specifically considered. In the case of N=2, the signal delay unit generates delay signals R1 and R2. The delay signal R1 is undelayed (a delay of 0-symbol period). Also, the delay signal R2 is delayed by ½-symbol period compared to the delay signal R1. The amplitude value of the delay signal R1 and the amplitude value of the delay signal R2 at a q-th (q=1 to K) symbol period will be respectively expressed as A(1, q) and A(2, q). Also, the amplitude value (amplitude value sampled L-th; $1 \leq L \leq 2*K+1$) of an added signal sampled every ½-symbol period is expressed as X(L).

At this time, equations $X(1)=A(1, 1)$, $X(2)=A(1, 1)+A(2, 1)$, $X(3)=A(2, 1)+A(1, 2)$, $X(4)=A(1, 2)+A(2, 2)$, . . . , $X(2*K)=A(2, K-1)+A(1, K)$, and $X(2*K+1)=A(2, K)$ are established. Additionally, structures of X(1) and X(2*K+1) are modified as appropriate according to a method of setting an initial value, a circuit configuration and the like. The configuration as described above is illustrated here for the simplicity of explanation. In the case of this example, A(1, 1) can be determined from X(1). Then, A(2, 1) can be calculated from X(2) by using A(1, 1). Then, A(1, 2) can be calculated from X(3) by using A(2, 1). It is possible to calculate A(1, q), A(2, q) (q=1 to K) in a similar manner. That is, the delay signals R1 and R2 can be calculated by sequentially performing calculation based on amplitude X of an added signal.

Although a little more complicated, calculation of the delay signal Rj from the amplitude value of an added signal is also possible for a case where $N \geq 3$ in the same manner. When making generalization for cases including the case where $N \geq 3$, in principle, a method of obtaining an amplitude value A(p, q) of a delay signal Rj from an amplitude value X(L) of an added signal will be as follows.

An amplitude value A(1, 1) is first calculated based on an amplitude value X(1), and an amplitude value A((p+1), 1) is calculated for each L ($2 \leq L \leq N$) based on an amplitude value X(L) and an amplitude value A(p, 1) (p=1 to L−1), an amplitude value A(1, (Q+1)) is calculated for each Q ($1 \leq Q \leq K-1$) based on an amplitude value X(Q*N+1) and an amplitude value A(p, q) (p=1 to N, q=1 to Q), and an amplitude value A(L', (Q+1)) is calculated for each L'($2 \leq L' \leq N$) based on an amplitude value X(Q*N+L'), the amplitude value A(p, q) (p=1 to N, q=1 to Q) and an amplitude value A(p', (Q+1)) (p'=1 to L'−1). The delay signal Rj is obtained by this method.

Furthermore, even if such complicated decoding method is not used, a binary symbol sequence can be restored by detecting a change in an amplitude value X of an added signal and controlling, according to the detection result, inversion of a symbol value detected at a previous timing.

As described above, the technology of the present embodiment relates to a method of transmitting, substantially in parallel, a plurality of data streams by separating input data into N data streams and multiplexing data streams in a transmission line. By adopting such method, high data rate can be realized while keeping the frequency band used for transmission of each data stream narrow.

Corresponding to First Embodiment

The configuration of the information processing apparatus described above can also be changed as follows, for example, as the configuration as described above of separating input data into a plurality of data streams and transmitting the same substantially in parallel. The information processing apparatus includes a distributor, an encoding unit, a signal generation unit, an amplitude adjusting unit, a signal addition unit and a signal transmitting unit as described below. The distributor distributes input data in units of M bits and generates two M-bit bit sequences. Also, the encoding unit converts each of the two bit sequences distributed by the distributor into a binary symbol sequence of K symbols and generates first and second binary symbol sequences. Then, the signal generation unit generates a first transmission signal having, as an amplitude value, each symbol value included in the first binary symbol sequence and a second transmission signal having, as an amplitude value, each symbol value included in the second binary symbol sequence.

In this manner, two binary symbol sequences are generated from input data by the distributor, the encoding unit and the signal generation unit, and transmission signals (first and second transmission signals) corresponding to respective binary symbol sequences are obtained. Then, the amplitude adjusting unit adjusts the amplitude value of the first transmission signal generated by the signal generation unit to 1/K (K is a natural number). For example, when expressing the amplitude value of the second transmission signal as A2, amplitude value A1 of the first transmission signal is adjusted by the amplitude adjusting unit to be A2/K. Then, the first transmission signal having the amplitude value A1 (A1=A2/K) and the second transmission signal having the amplitude value A2 are input to the signal addition unit.

The signal addition unit synchronously adds the first transmission signal whose amplitude value is adjusted by the amplitude adjusting unit described above and the second transmission signal generated by the signal generation unit and generates an added signal. Then, the signal transmission unit transmits the added signal generated by the signal addition unit.

For example, when the amplitude value A2 of the second transmission signal is A or −A, the amplitude value of the added signal will be any of a first amplitude value (1+1/K)*A, a second amplitude value (1−1/K)*A, a third amplitude value (−1+1/K)*A and a fourth amplitude value (−1−1/K)*A. Since the first to fourth amplitude values are values different from each other, it is possible to determine which of the first to fourth amplitude values the amplitude value of the added signal is and to detect the amplitude values of the first and second transmission signals according to the determination result. Then, two binary symbol sequences can be restored from the detection result. That is, two data streams can be simultaneously transmitted.

As with the first configuration described above, by adopting this method, high data rate can be realized while keeping the frequency band used for transmission of each data stream narrow.

(Notes)

The 3B4B encoders 304 and 306 are examples of the encoding unit and the signal generation unit. The delay circuit 308 is an example of the signal delay unit. The adder 310 is an example of the signal addition unit. The selection circuit 314 is an example of the signal transmitting unit. The delay circuit 326, the subtractor 324, the absolute value circuit 328 and the toggle circuits 334 and 338 are examples of an amplitude detection unit and a symbol value calculation unit. The 3B4B decoders 336 and 340 are examples of a decoding unit. The selector 342 is an example of a data restoration unit. The baseband processor 22 is an example of an arithmetic processing unit.

The 3B4B encoders 204 and 210 are examples of the encoding unit. The 3B4B encoders 204 and 210 and the P/S conversion units 208 and 214 are examples of the signal generation unit. The attenuator 216 is an example of the amplitude adjusting unit. The adder 218 is an example of the signal addition unit and the signal transmitting unit. The comparators 232, 238, 240 are examples of an amplitude determination unit. The comparator 232, the selector 242 and the S/P conversion units 234 and 246 are examples of a symbol sequence restoration unit. The 3B4B decoders 236 and 248 are examples of a decoding unit. The combining circuit 250 is an example of a data restoration unit.

It should be understood by those skilled in the art that various modifications, combinations, sub-combinations and alterations may occur depending on design requirements and other factors insofar as they are within the scope of the appended claims or the equivalents thereof.

For example, although a 3B4B code has been taken as an example in the description of the embodiment above, a code other than the 3B4B code may also be used as long as the code is a binary code with good DC balance (a binary code whose DC balance is sufficiently suppressed). Also, two codes to be added do not have to be the same code. For example, a configuration is possible according to which a 3B4B code and an 8B10B code are added. Furthermore, in the second embodiment described above, two codes are added up with one being delayed by ½ symbol. However, extension to three branches is possible by using three codes and adding up the codes with one being delayed by ⅓ symbol and one being delayed by ⅔ symbol. Similarly, extension to four or more branches is also possible.

The present application contains subject matter related to that disclosed in Japanese Priority Patent Application JP 2009-257350 filed in the Japan Patent Office on Nov. 10, 2009, the entire content of which is hereby incorporated by reference.

What is claimed is:

1. An information processing apparatus comprising:
   a distributor to distribute input data in units of M bits and to generate N M-bit bit sequences;
   an encoding unit to convert each of the N bit sequences distributed by the distributor into a binary symbol sequence of K symbols and to generate N binary symbol sequences;
   a signal generation unit to generate N transmission signals Sj (j=1 to N) synchronized with a specific symbol clock and having, as an amplitude value, each symbol value included in the N binary symbol sequences;
   a signal delay unit to delay, with regard to j (j=1 to N), the transmission signals Sj generated by the signal generation unit by a (j−1)/N-symbol period and to generate delay signals Rj;
   a signal addition unit to add that adds the delay signals Rj (j=1 to N) generated by the signal delay unit and to generate an added signal; and
   a signal transmitting unit to transmit the added signal generated by the signal addition unit.

2. The information processing apparatus according to claim 1, further comprising:
   a signal receiving unit to receive the added signal transmitted by the signal transmitting unit;
   an amplitude detection unit to sequentially detect, every 1/N-symbol period, an amplitude value of the added signal;
   a symbol value calculation unit to calculate each symbol value included in the N binary symbol sequences based at least in part on the amplitude value of the added signal detected by the amplitude detection unit;
   a decoding unit to convert the N binary symbol sequences including each symbol value calculated by the symbol value calculation unit into the M-bit bit sequences and to decode the N bit sequences; and a data restoration unit to combine the N-bit sequences decoded by the decoding unit and to restore the input data.

3. The information processing apparatus according to claim 2, wherein symbol values located at a beginning of the N binary symbol sequences are set to a same specific value for all the N binary symbol sequences, and wherein the symbol value calculation unit calculates each symbol value included in the N binary symbol sequences by detecting a change in the amplitude value of the added signal detected by the amplitude detection unit, and, in a case there is a change, setting, as a current symbol value, a symbol value inverted from a previous symbol value included in a same binary symbol sequence and, in a case there is no change, sequentially repeating a process of setting, as the current symbol value, a symbol value same as the previous symbol value included in the same binary symbol sequence.

4. The information processing apparatus according to claim 3, wherein the encoding unit converts the M-bit bit sequence into the binary symbol sequence of K symbols whose DC component is suppressed.

5. The information processing apparatus according to claim 2, wherein symbol values located at a beginning of the N binary symbol sequences are set to a same specific value for all the N binary symbol sequences, wherein the signal transmission unit adds a synchronization signal before the added signal and transmits the added signal to which the synchronization signal has been added, and wherein, at a part following the synchronization signal, the symbol value calculation unit calculates a first amplitude value $A(1, 1)$ at a first symbol period of the transmission signal S1 based at least in part on a second amplitude value $X(1)$ detected first by the amplitude detection unit, calculates a third amplitude value $A((p+1), 1)$ at a first symbol period of the transmission signal SL based at least in part on a fourth amplitude value $X(L)$ detected L-th ($2 \leq L \leq N$) by the amplitude detection unit and a fifth amplitude value $A(p, 1)$ ($p=1$ to $L-1$), calculates a sixth amplitude value $A(1, (Q+1))$ at a $(Q+1)$-th symbol period of the transmission signal S1 based at least in part on a seventh amplitude value $X(Q^*N+1)$ detected $(Q^*N+1)$-th ($1 \leq Q \leq K-1$) by the amplitude detection unit and an eighth amplitude value $A(p, q)$ ($p=1$ to N, $q=1$ to Q), and calculates a ninth amplitude value $A(L', (Q+1))$ at a $(Q+1)$-th symbol period of the transmission signal SL' based at least in part on a tenth amplitude value $X(Q^*N+L')$ detected $(Q^*N+L')$-th ($2 \leq L' \leq N$) by the amplitude detection unit, the amplitude value $A(p, q)$ ($p=1$ to N, $q=1$ to Q) and an amplitude value $A(p', (Q+1))$ ($p'=1$ to $L'-1$).

6. The information processing apparatus according to claim 2, further comprising:

an arithmetic processing unit to output image data; and a display unit to display the image data, wherein the input data is the image data that is output from the arithmetic processing unit, and wherein the display unit displays the image data restored by the data restoration unit.

7. A signal processing method comprising the steps of:

distributing input data in units of M bits and generating N M-bit bit sequences;

converting each of the N bit sequences distributed in the step of distributing into binary symbol sequence of K symbols and generating N binary symbol sequences;

generating N transmission signals Sj ($j=1$ to N) synchronized with a specific symbol clock and having, as an amplitude value, each symbol value included in the N binary symbol sequences;

delaying, with regard to j ($j=1$ to N), the transmission signals Sj generated in the step of generating by a $(j-1)/N$-symbol period and generating delay signals Rj; and adding the delay signals Rj ($j=1$ to N) generated in the step of delaying and generating an added signal.

8. An information processing apparatus comprising:

a distributor to distribute input data in units of M bits and to generate two M-bit bit sequences;

an encoding unit to convert each of the two bit sequences distributed by the distributor into a binary symbol sequence of K symbols and to generate first and second binary symbol sequences;

a signal generation unit to generate a first transmission signal having, as a first amplitude value, each symbol value included in the first binary symbol sequence and a second transmission signal having, as a second amplitude value, each symbol value included in the second binary symbol sequence;

an amplitude adjusting unit to adjust the first amplitude value of the first transmission signal generated by the signal generation unit to 1/K (K is a natural number);

a signal addition unit to synchronously add the first transmission signal whose first amplitude value has been adjusted by the amplitude adjusting unit and the second transmission signal generated by the signal generation unit and to generate an added signal; and a signal transmitting unit that transmits the added signal generated by the signal addition unit.

9. The information processing apparatus according to claim 8, further comprising:

a signal receiving unit to receive that receives the added signal transmitted by the signal transmitting unit;

an amplitude determination unit to determine, in a case the first amplitude value of the first transmission signal adjusted by the amplitude adjusting unit is A or −A and the second amplitude value of the second transmission signal is B or −B (A=B/K), a third amplitude value of the added signal received by the signal receiving unit by using a plurality of threshold values for distinguishing between a fourth amplitude value (B+A), a fifth amplitude value (B−A), a sixth third amplitude value (−B+A) and a seventh amplitude value (−B−A);

a symbol sequence restoration unit to detect the first and second amplitude values of the first and second transmission signals based at least in part on a result of determination by the amplitude determination unit and to restore the first and second binary symbol sequences;

a decoding unit to convert the first and second binary symbol sequences restored by the symbol sequence restoration unit into the two bit sequences; and a data restoration unit to combine the two bit sequences obtained by conversion by the decoding unit and to restore the input data.

10. The information processing apparatus according to claim 9, wherein the encoding unit converts the M-bit sequence into the binary symbol sequence of K symbols whose DC component is suppressed.

11. The information processing apparatus according to claim 10, further comprising:
   an arithmetic processing unit to output image data; and
   a display unit to display the image data,
   wherein the input data is the image data that is output from the arithmetic processing unit, and
   wherein the display unit displays the image data restored by the data restoration unit.

12. A signal processing method comprising the steps of:
   distributing input data in units of M bits and generating two M-bit bit sequences;
   converting each of the bit sequences distributed in the step of distributing into a binary symbol sequence of K symbols and generating first and second binary symbol sequences;
   generating a first transmission signal having, as a first amplitude value, each symbol value included in the first binary symbol sequence and a second transmission signal having, as a second amplitude value, each symbol value included in the second binary symbol sequence;
   adjusting the first amplitude value of the first transmission signal generated in the step of generating to 1/K (K is a natural number); and
   synchronously adding the first transmission signal whose first amplitude value has been adjusted in the step of adjusting and the second transmission signal generated in the step of generating and generating an added signal.

* * * * *